US012690216B2

(12) United States Patent
Lin et al.

(10) Patent No.: US 12,690,216 B2
(45) Date of Patent: Jul. 21, 2026

(54) STRUCTURE AND FORMATION METHOD OF SEMICONDUCTOR DEVICE WITH SEMICONDUCTOR NANOSTRUCTURES

(71) Applicant: Taiwan Semiconductor Manufacturing Company, Ltd., Hsinchu (TW)

(72) Inventors: Ta-Chun Lin, Hsinchu (TW); Jhon-Jhy Liaw, Zhudong Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 382 days.

(21) Appl. No.: 18/402,890

(22) Filed: Jan. 3, 2024

(65) Prior Publication Data

US 2025/0203903 A1    Jun. 19, 2025

Related U.S. Application Data

(60) Provisional application No. 63/609,396, filed on Dec. 13, 2023.

(51) Int. Cl.
H10D 30/43 (2025.01)
H10D 30/01 (2025.01)
(Continued)

(52) U.S. Cl.
CPC ........... H10D 30/43 (2025.01); H10D 30/014 (2025.01); H10D 30/6735 (2025.01);
(Continued)

(58) Field of Classification Search
CPC .. H10D 30/43; H10D 30/014; H10D 30/6735; H10D 30/6757; H10D 62/121; H10D 64/017; H10D 64/018; H10D 64/258; H10D 84/0179; H10D 84/038; H10D 84/856; H10D 30/0194; H10D 30/503;
(Continued)

(56) References Cited

U.S. PATENT DOCUMENTS

| | | | |
|---|---|---|---|
| 9,209,247 B2 | 12/2015 | Colinge | |
| 9,236,267 B2 | 1/2016 | De | |

(Continued)

*Primary Examiner* — Victor A Mandala
(74) *Attorney, Agent, or Firm* — McClure, Qualey & Rodack, LLP

(57) ABSTRACT

A semiconductor device structure and a formation method are provided. The method includes forming a fin structure over a substrate, and the fin structure has multiple sacrificial layers and multiple semiconductor layers laid out in an alternating manner. The method also includes forming a dummy gate stack extending across a portion of the fin structure and forming gate spacers over sidewalls of the dummy gate stack. The gate spacers extend across portions of the fin structure. The method further includes removing the dummy gate stack to form a trench exposing the portion of the fin structure and trimming the semiconductor layers exposed by the trench. Each of the semiconductor layers covered by the gate spacers becomes wider than each of the semiconductor layers that is trimmed. In addition, the method includes removing the sacrificial layers and forming a metal gate stack wrapped around the semiconductor layers.

20 Claims, 36 Drawing Sheets

(51) Int. Cl.

| | |
|---|---|
| *H10D 30/67* | (2025.01) |
| *H10D 62/10* | (2025.01) |
| *H10D 64/01* | (2025.01) |
| *H10D 64/23* | (2025.01) |
| *H10D 84/01* | (2026.01) |
| *H10D 84/03* | (2025.01) |
| *H10D 84/85* | (2025.01) |

(52) U.S. Cl.
CPC ....... *H10D 30/6757* (2025.01); *H10D 62/121* (2025.01); *H10D 64/017* (2025.01); *H10D 64/018* (2025.01); *H10D 64/258* (2025.01); *H10D 84/0179* (2025.01); *H10D 84/038* (2025.01); *H10D 84/856* (2025.01)

(58) Field of Classification Search
CPC ............. H10D 30/504; H10D 30/0195; H10D 30/508; H10D 62/116; H10D 62/822; H10D 30/0193; H10D 30/797; H10D 84/0128; H10D 84/8311; H10D 84/832; B82Y 10/00
See application file for complete search history.

(56) References Cited

U.S. PATENT DOCUMENTS

| | | | | |
|---|---|---|---|---|
| 9,412,817 | B2 | 8/2016 | Yang | |
| 9,412,828 | B2 | 8/2016 | Ching | |
| 9,472,618 | B2 | 10/2016 | Oxland | |
| 9,502,265 | B1 | 11/2016 | Jiang | |
| 9,520,482 | B1 | 12/2016 | Chang | |
| 9,536,738 | B2 | 1/2017 | Huang | |
| 9,576,814 | B2 | 2/2017 | Wu | |
| 9,608,116 | B2 | 3/2017 | Ching | |
| 9,991,388 | B2 * | 6/2018 | Ching | H10D 30/6713 |
| 10,204,985 | B2 * | 2/2019 | Lee | H10D 62/121 |
| 12,563,815 | B2 * | 2/2026 | Chen | H10D 84/013 |
| 2021/0343858 | A1 * | 11/2021 | Wang | H10D 30/6757 |
| 2023/0157011 | A1 * | 5/2023 | Chang | H10W 20/491 |
| | | | | 257/379 |
| 2024/0105794 | A1 * | 3/2024 | Wang | H10D 30/6735 |
| 2025/0022877 | A1 * | 1/2025 | Lin | H10D 64/518 |
| 2025/0133784 | A1 * | 4/2025 | Liaw | H10D 84/832 |
| 2025/0226219 | A1 * | 7/2025 | Huang | H10P 76/2041 |
| 2025/0318194 | A1 * | 10/2025 | Liu | H10D 84/0158 |
| 2025/0351512 | A1 * | 11/2025 | Chou | H10D 30/6757 |
| 2026/0040621 | A1 * | 2/2026 | Huang | H10D 30/6735 |

* cited by examiner

STRUCTURE AND FORMATION METHOD OF SEMICONDUCTOR DEVICE WITH SEMICONDUCTOR NANOSTRUCTURES

PRIORITY CLAIM AND CROSS-REFERENCE

This application claims the benefit of U.S. Provisional Application No. 63/609,396, filed on Dec. 13, 2023, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2Q are various cross-sectional views of various stages of a process for forming portions of a semiconductor device structure, in accordance with some embodiments.

FIGS. 2D-1 to 2Q-1 are various cross-sectional views of various stages of a process for forming portions of a semiconductor device structure, in accordance with some embodiments.

FIGS. 2D-2 to 2H-2, FIG. 2J-2, and FIG. 2Q-2 are various cross-sectional views of various stages of a process for forming portions of a semiconductor device structure, in accordance with some embodiments.

DETAILED DESCRIPTION

Figure 1A:
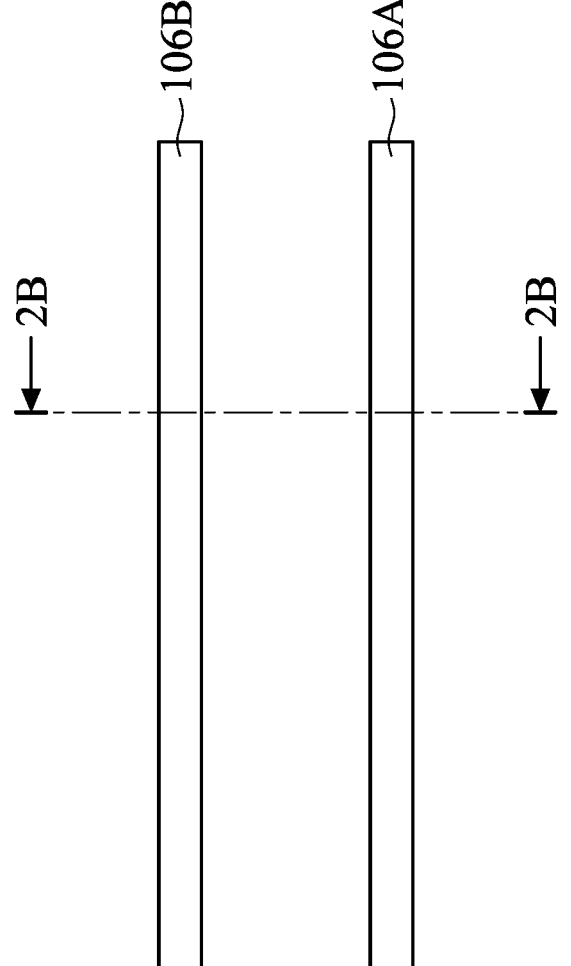
FIGS. 1A-1B are top views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100% of what is specified. Furthermore, terms such as "substantially parallel" or "substantially perpendicular" are to be interpreted as not to exclude insignificant deviation from the specified arrangement and may include for example deviations of up to 10 degrees in some embodiments. The word "substantially" does not exclude "completely" e.g. a composition which is "substantially free" from Y may be completely free from Y in some embodiments.

Terms such as "about" in conjunction with a specific distance or size are to be interpreted so as not to exclude insignificant deviation from the specified distance or size and may include for example deviations of up to 10% of what is specified in some embodiments. The term "about" in relation to a numerical value x may mean x ±5 or 10% of what is specified in some embodiments.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
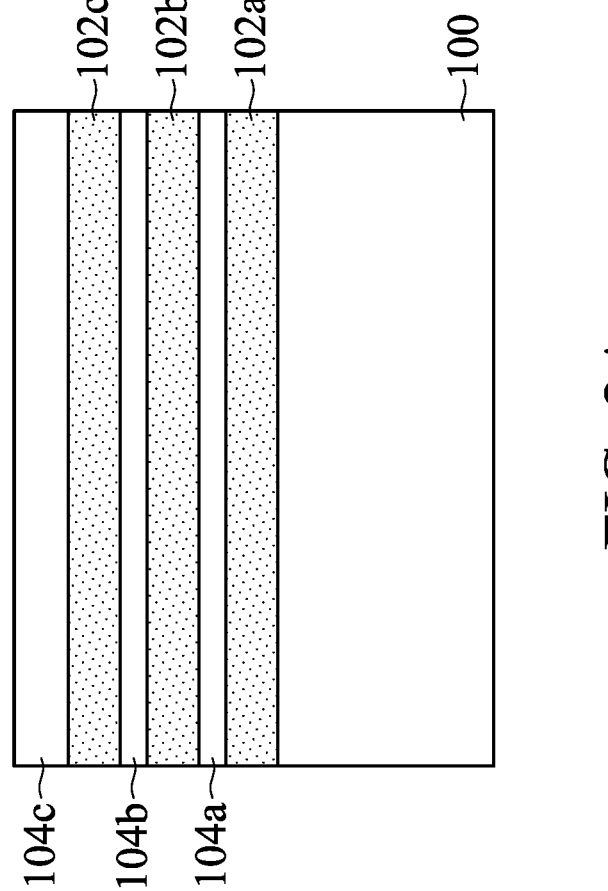
Figure 2B:
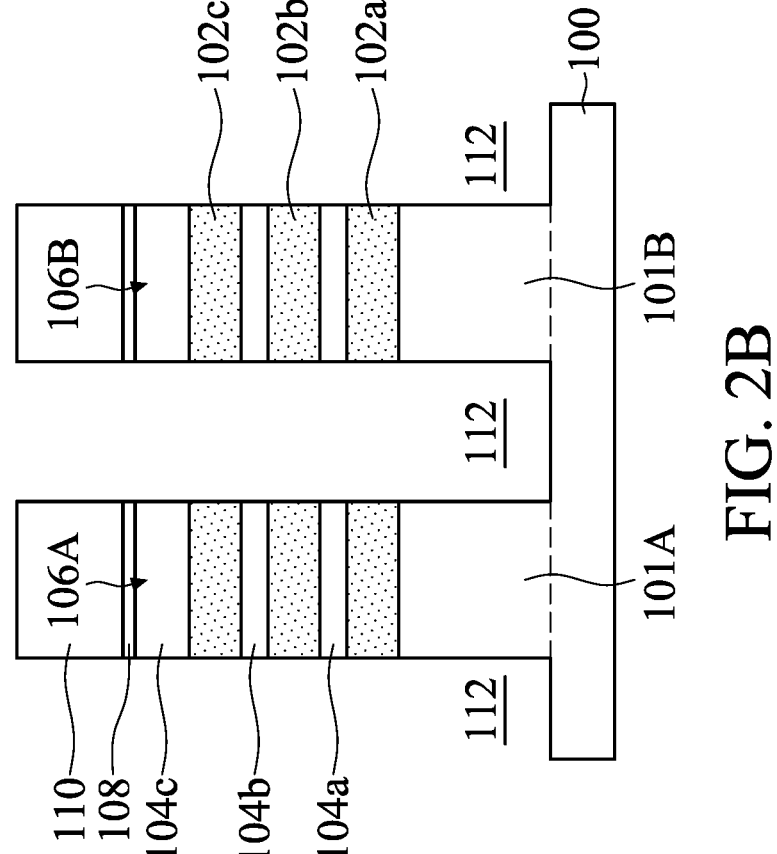
Figure 2C:
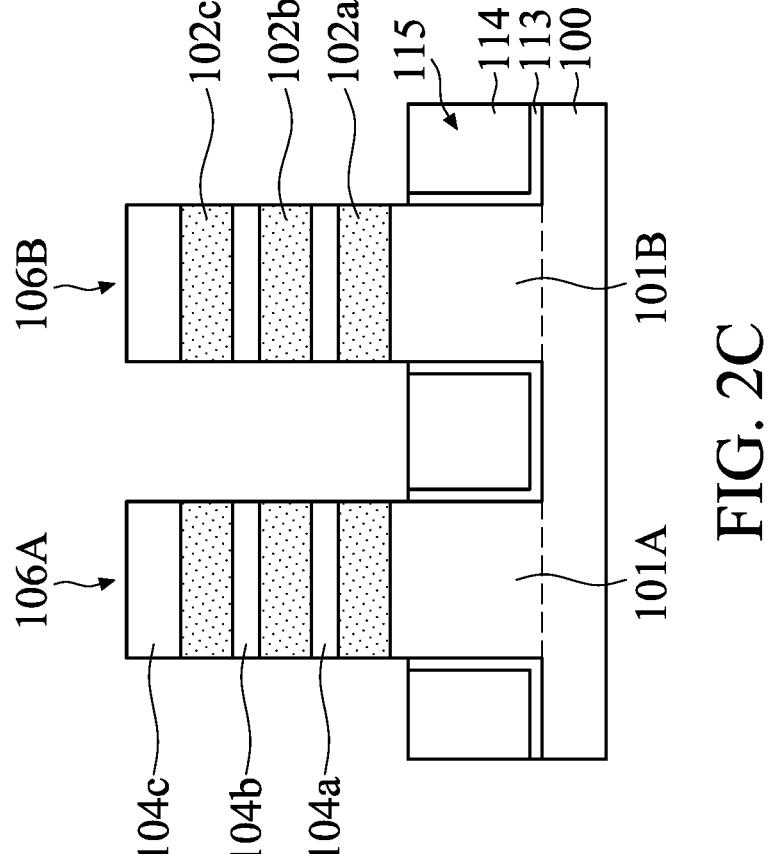
Figures 1, 2D:
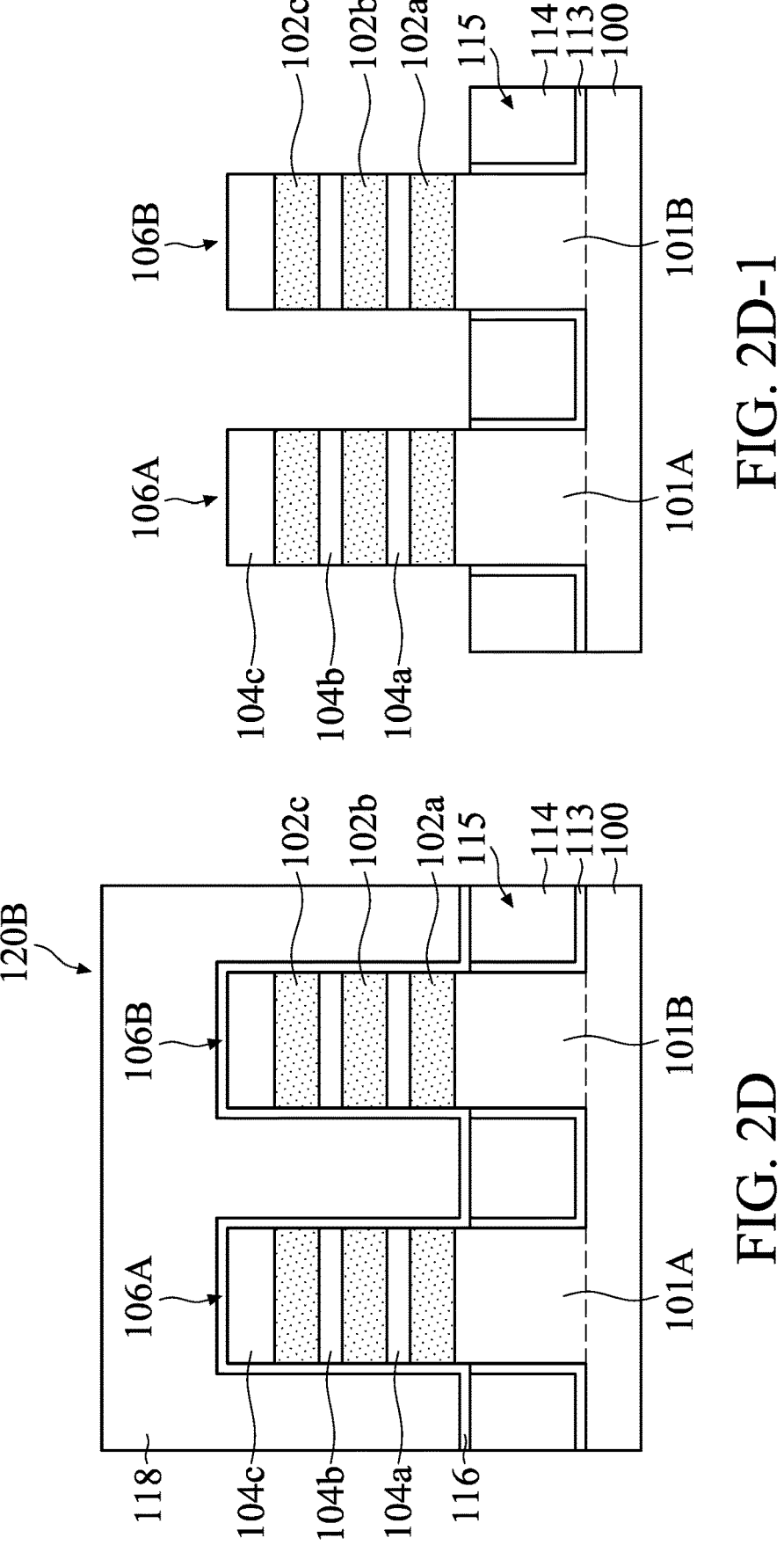
Figures 2, 2D:
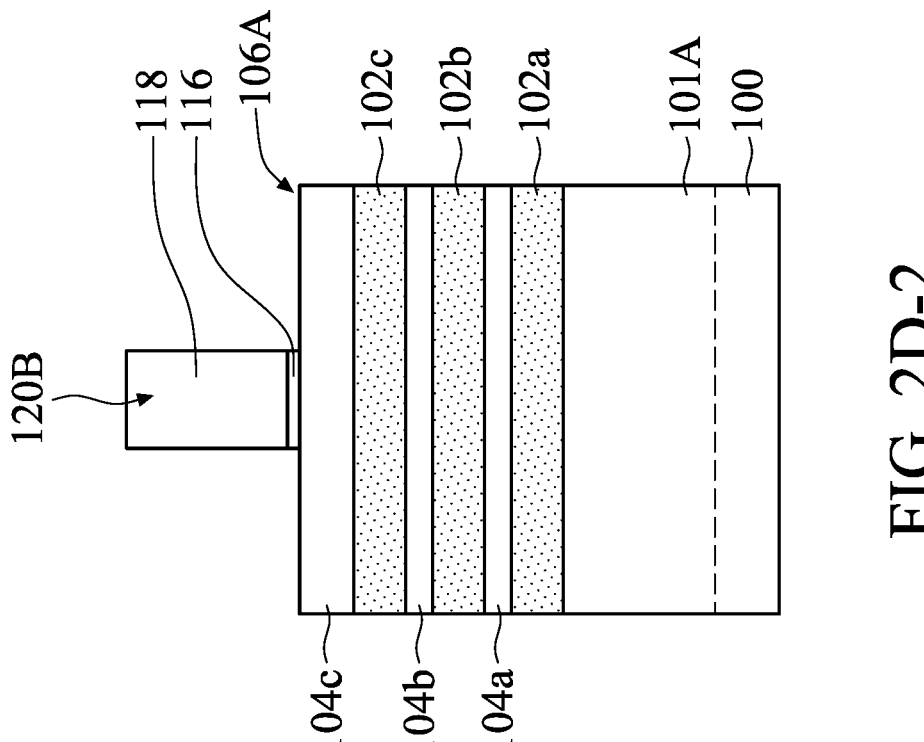
Figures 1, 2E:
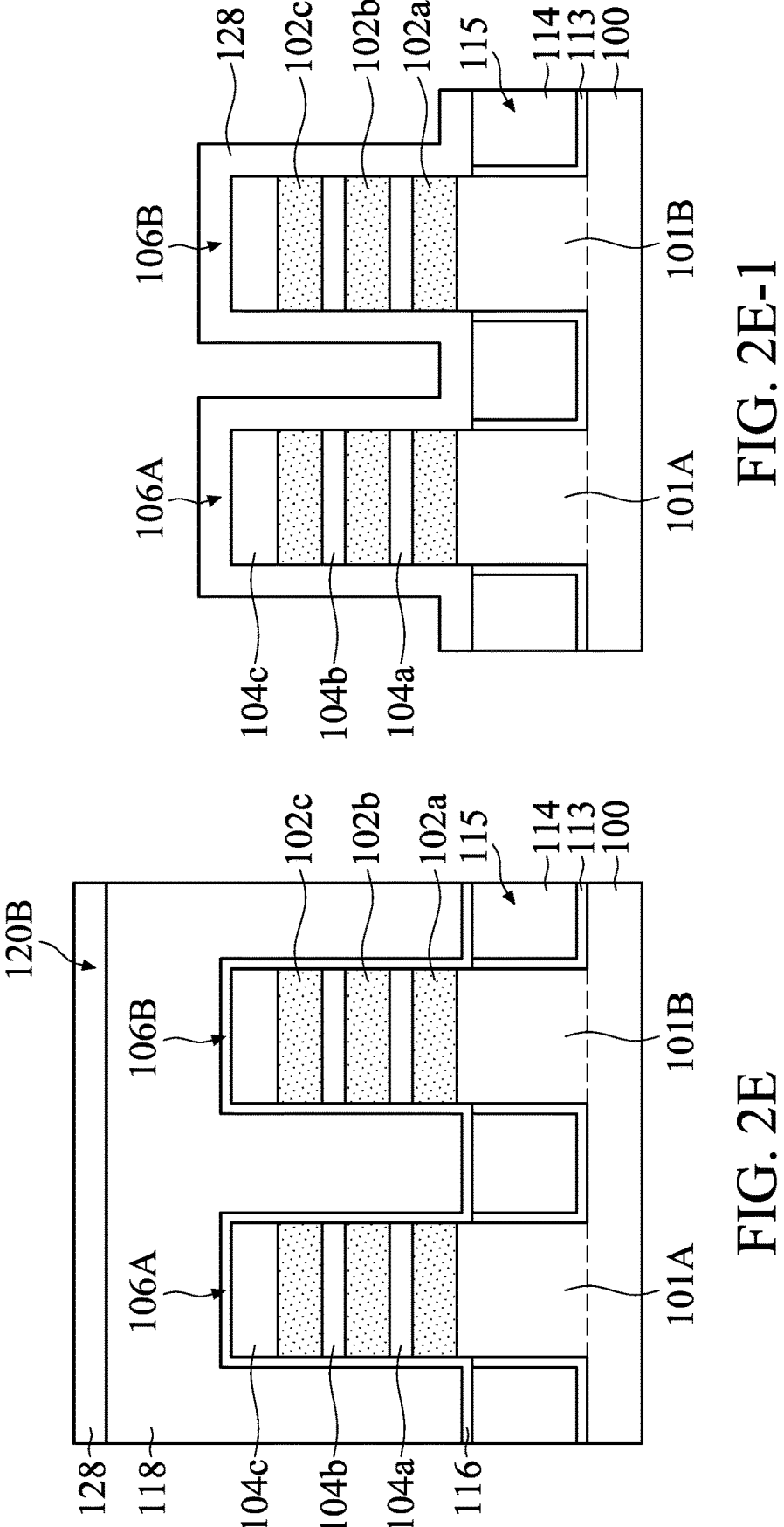
Figures 2, 2E:
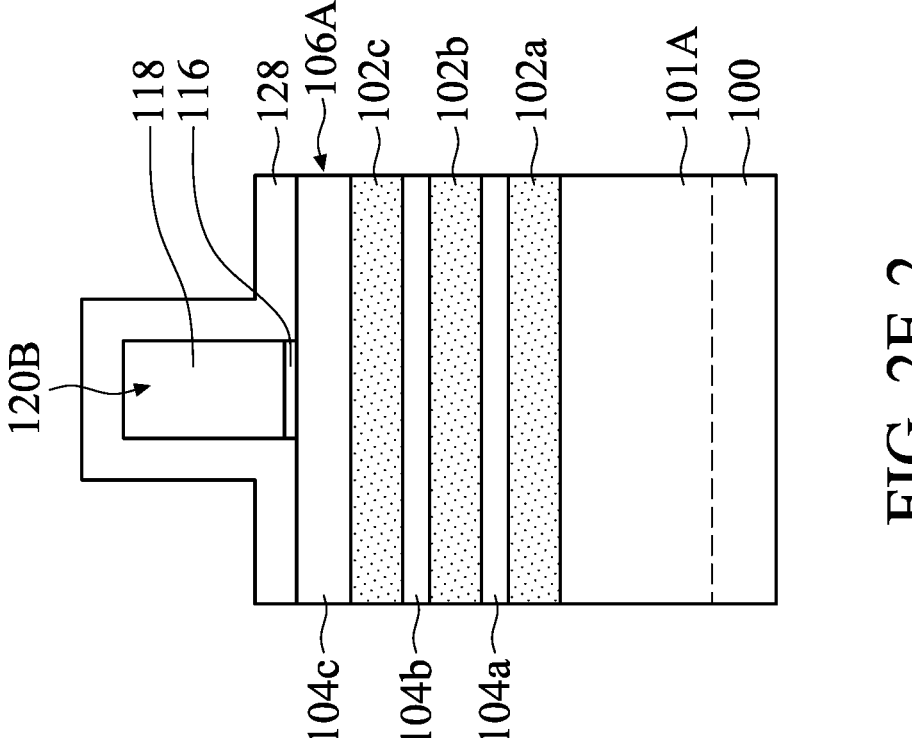
Figures 1, 2F:
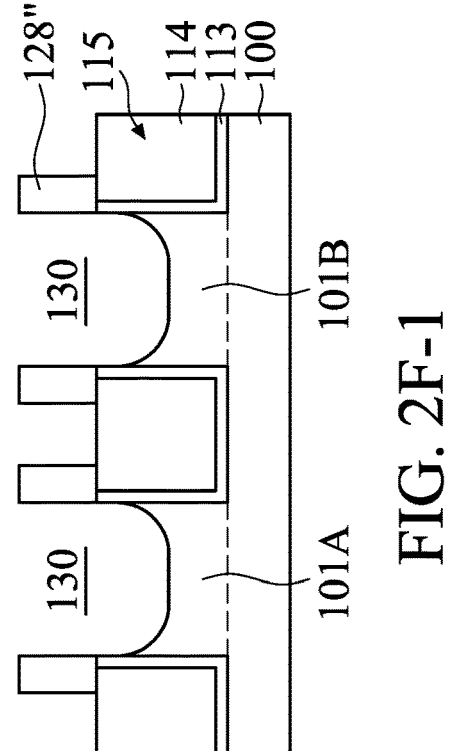
Figure 2F:
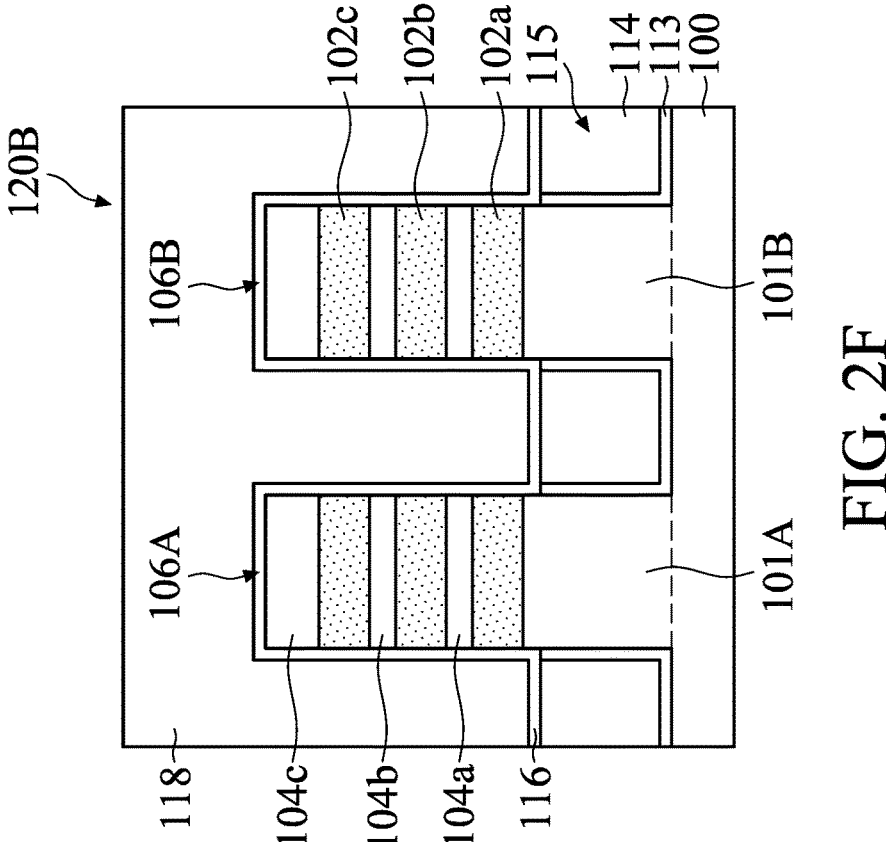
Figures 2, 2F:
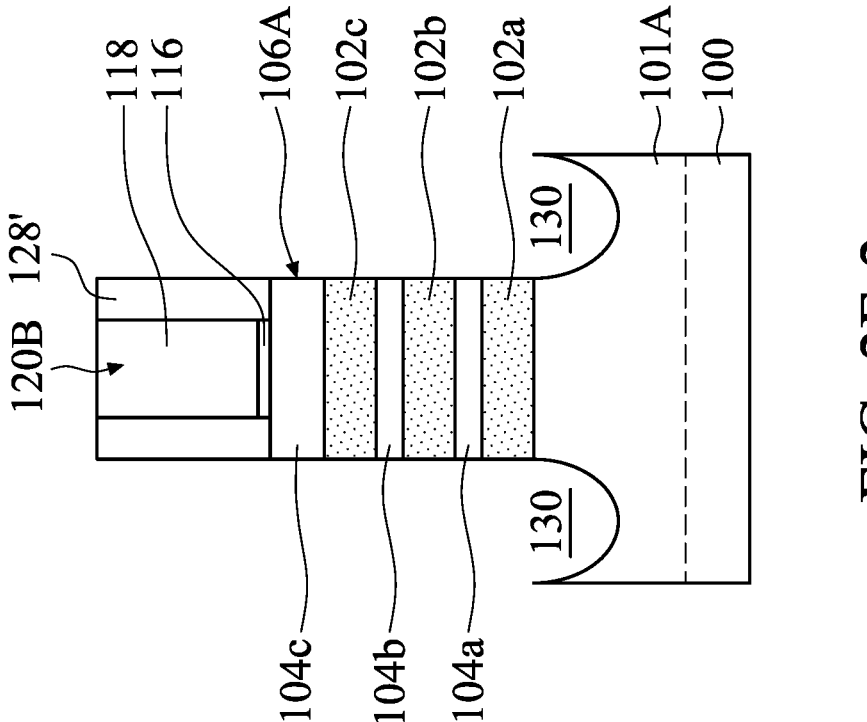
Figures 1, 2G:
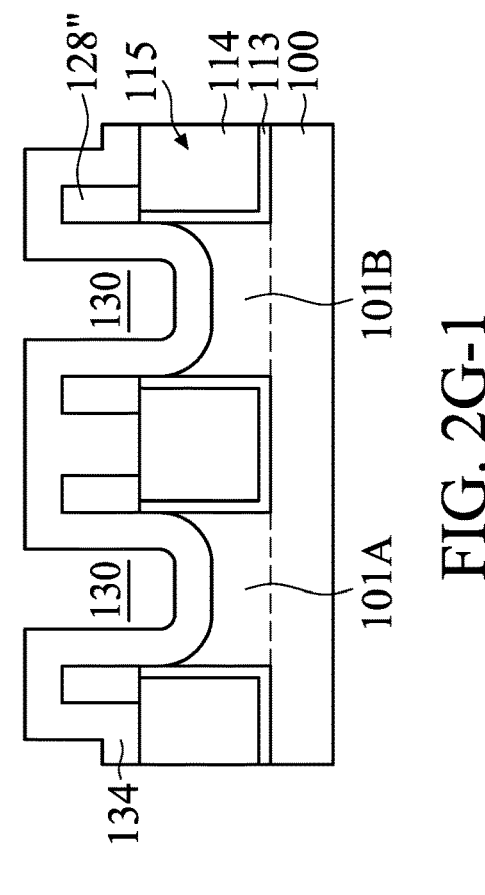
Figure 2G:
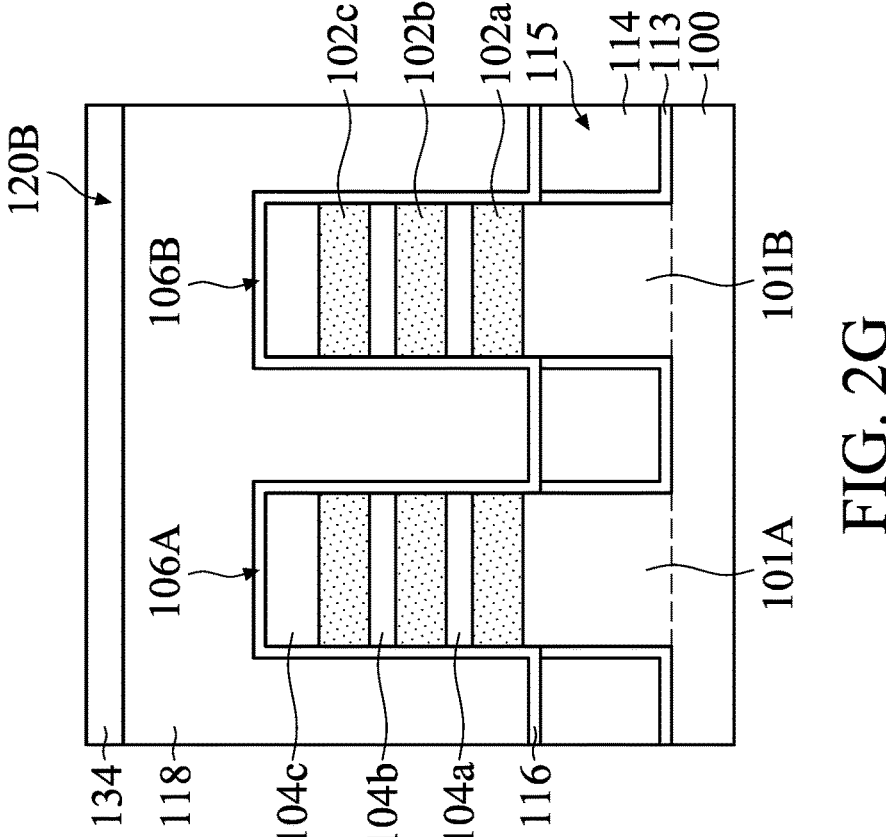
Figures 2, 2G:
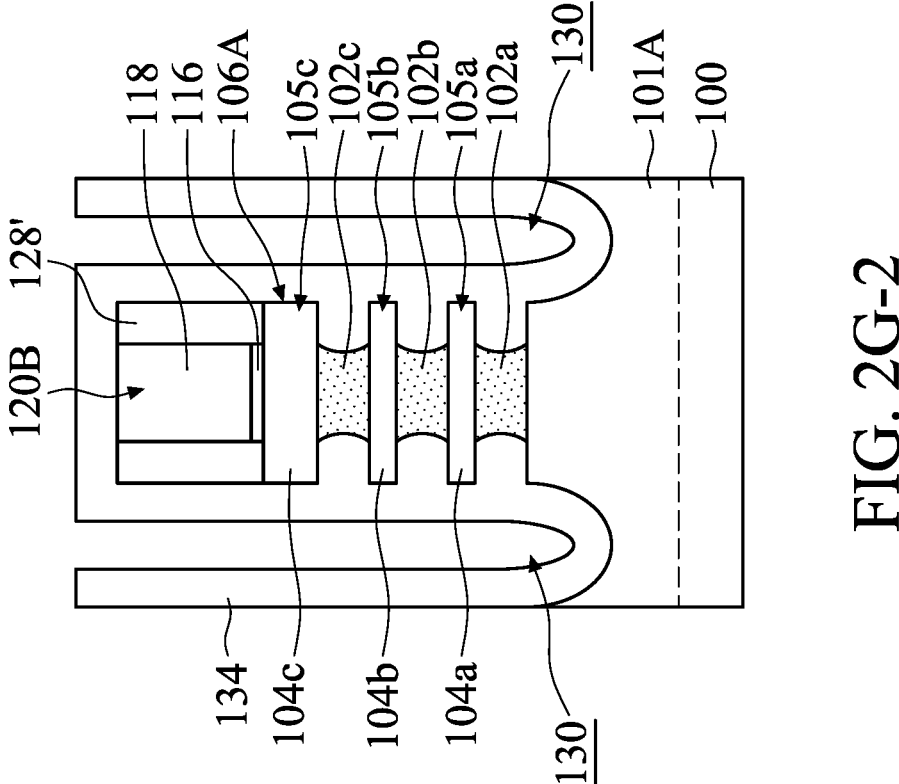
Figures 1, 2H:
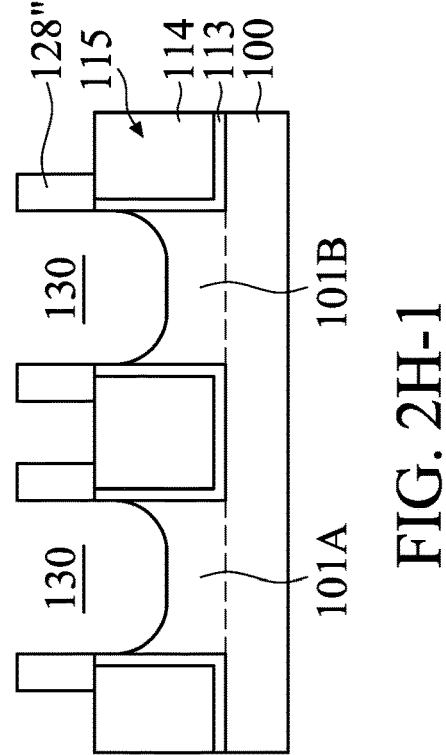
Figure 2H:
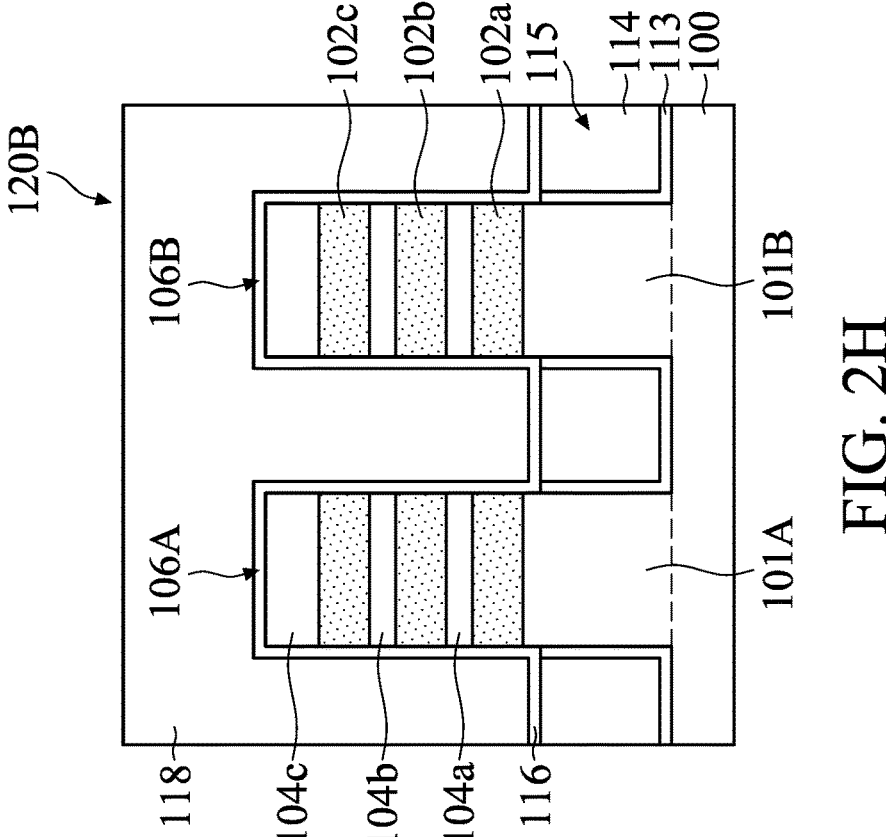
Figures 2, 2H:
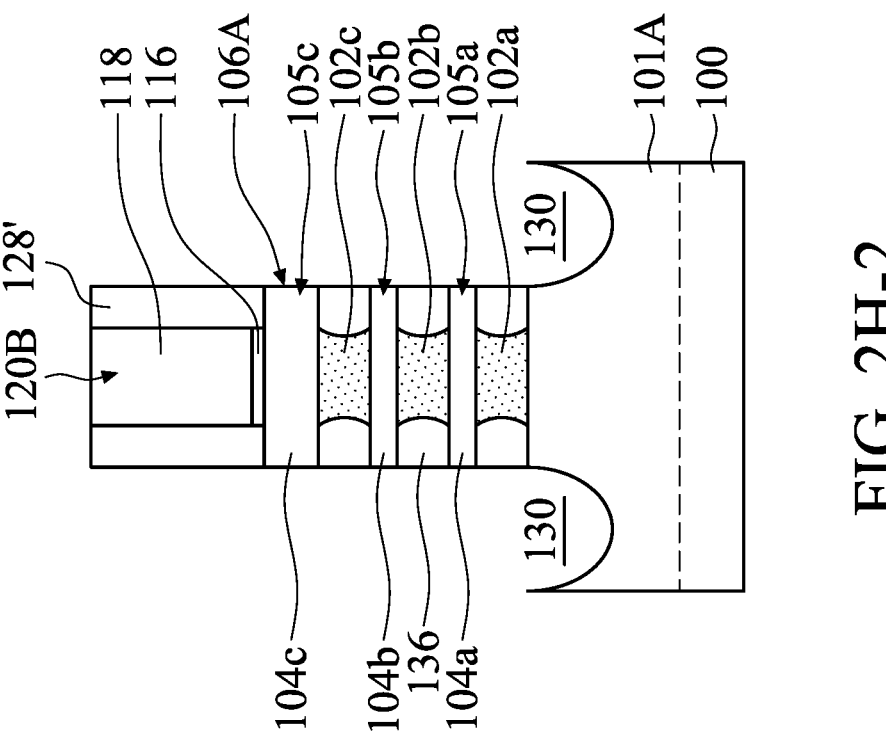
Figures 1, 2I:
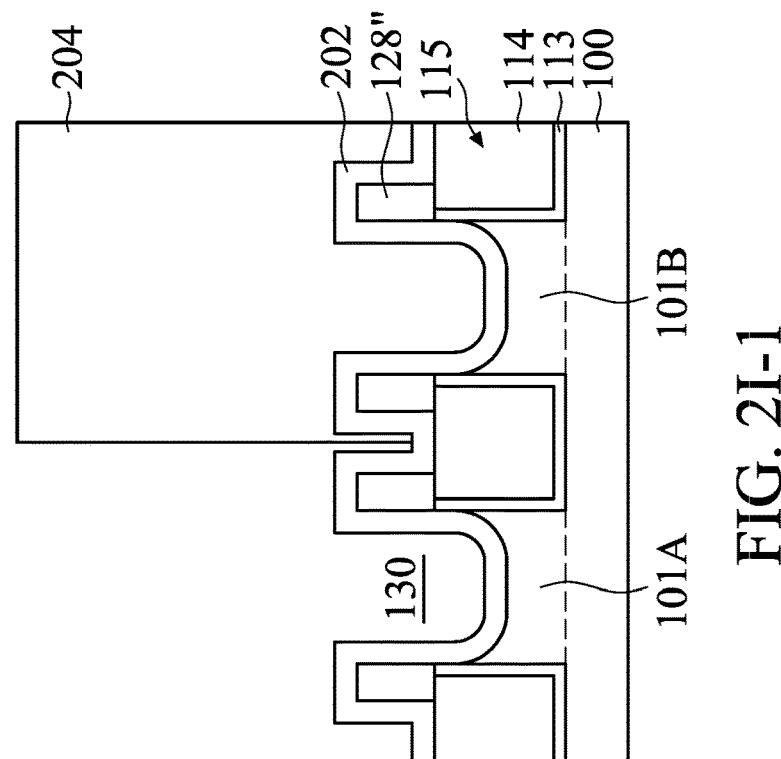
Figure 2I:
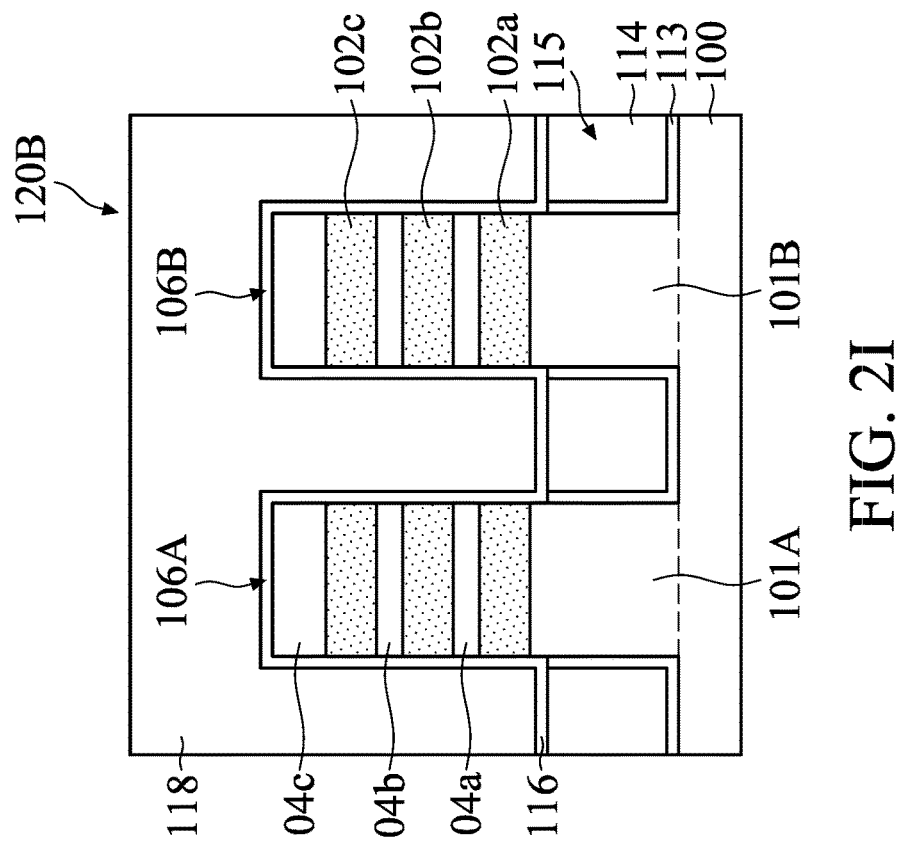
Figures 1, 2J:
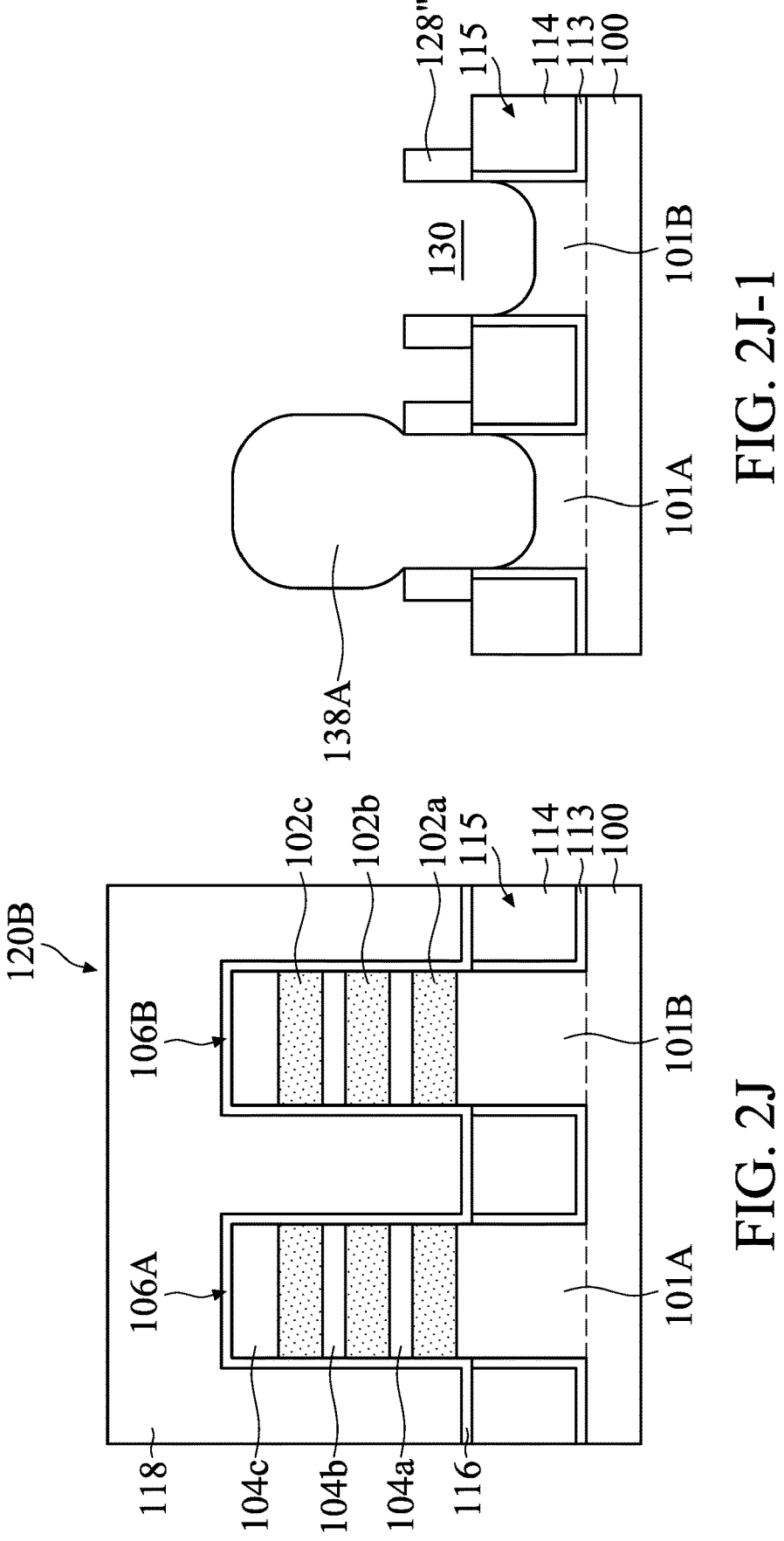
Figures 2, 2J:
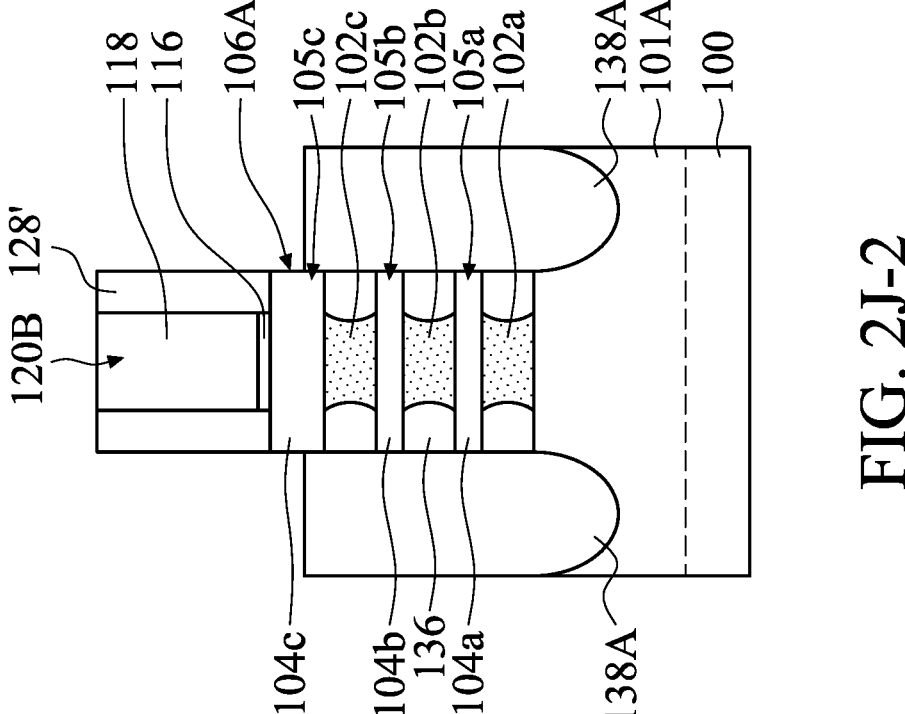
Figures 1, 2K:
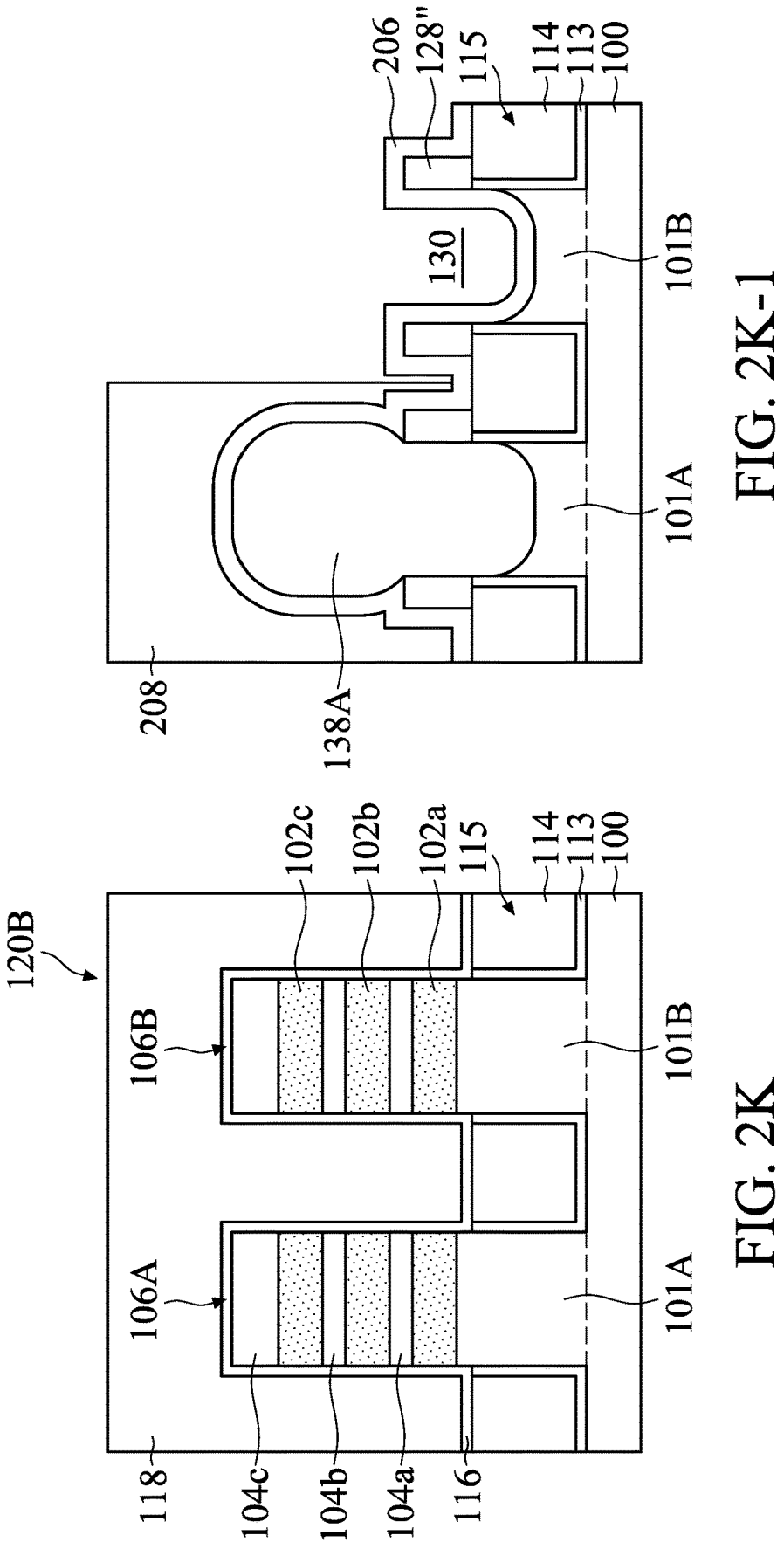
Figures 1, 2L:
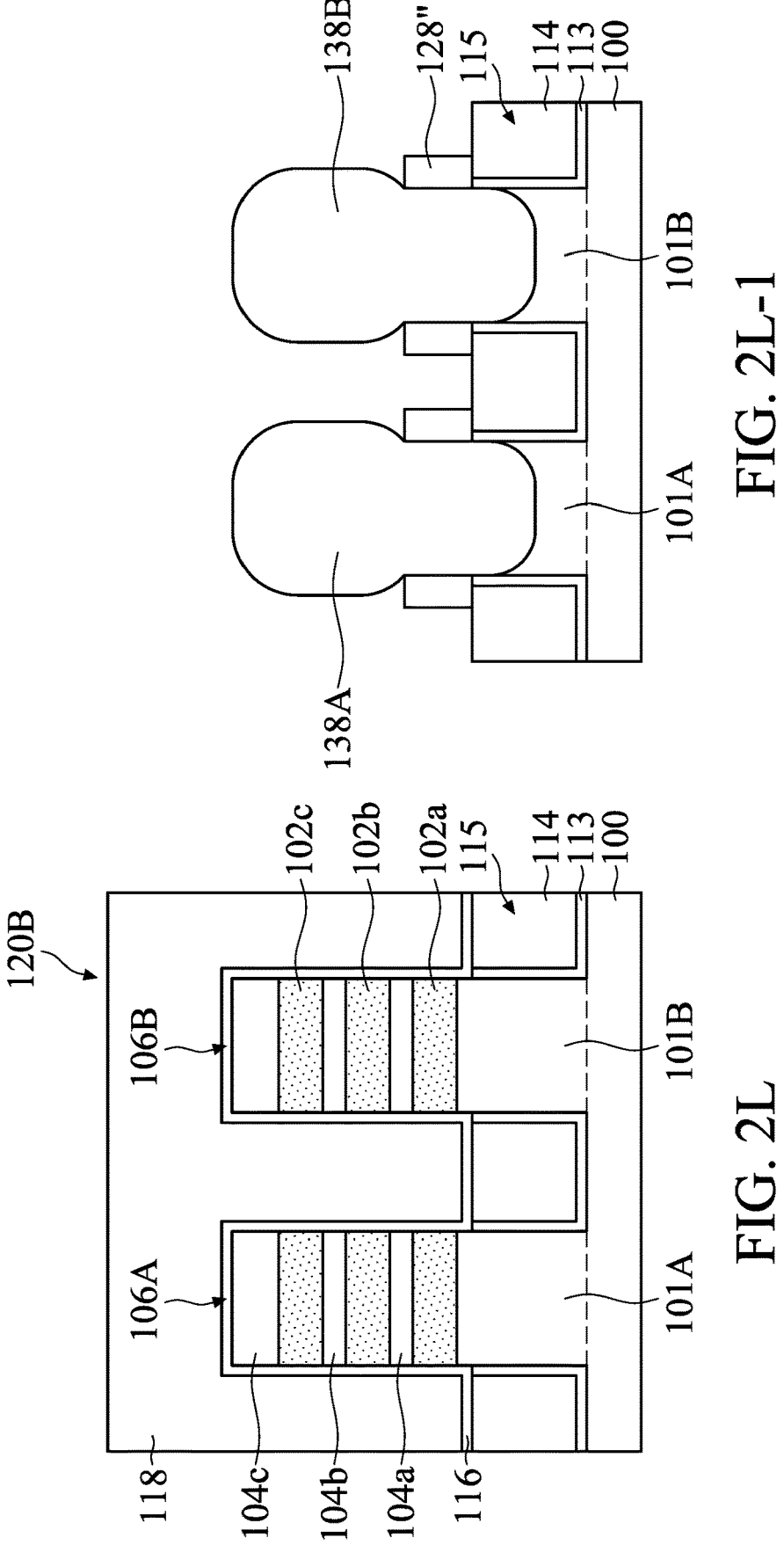
Figures 1, 2M:
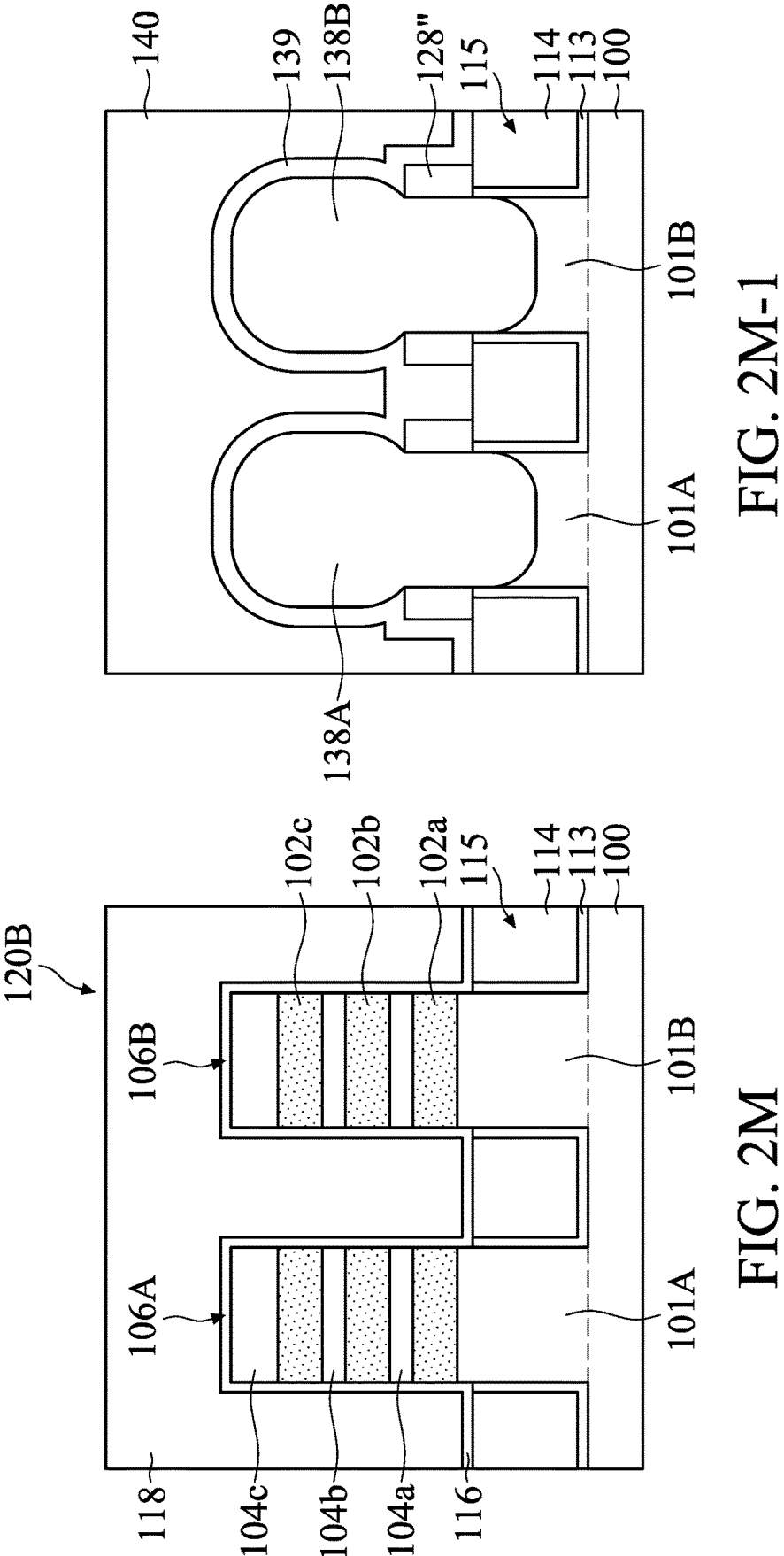
Figures 1, 2N:
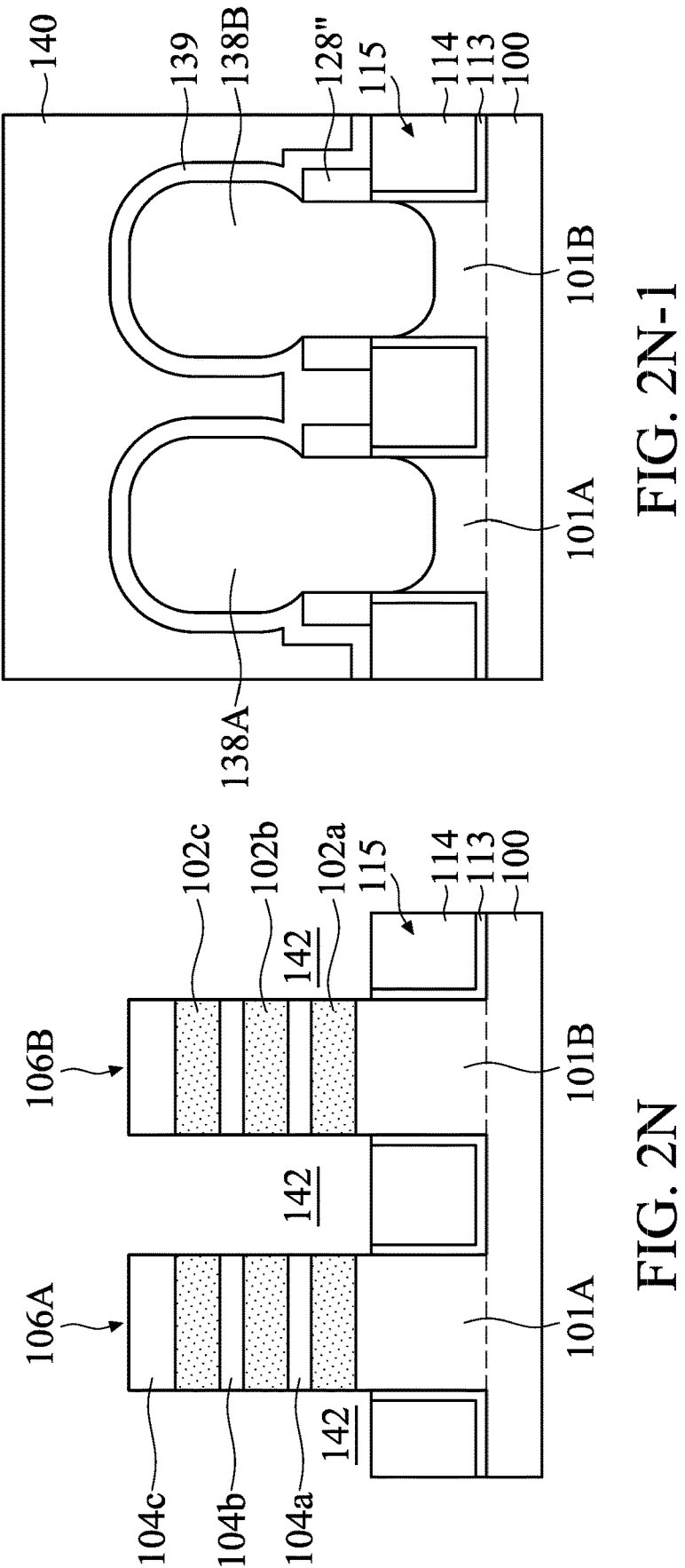
Figures 1, 2O:
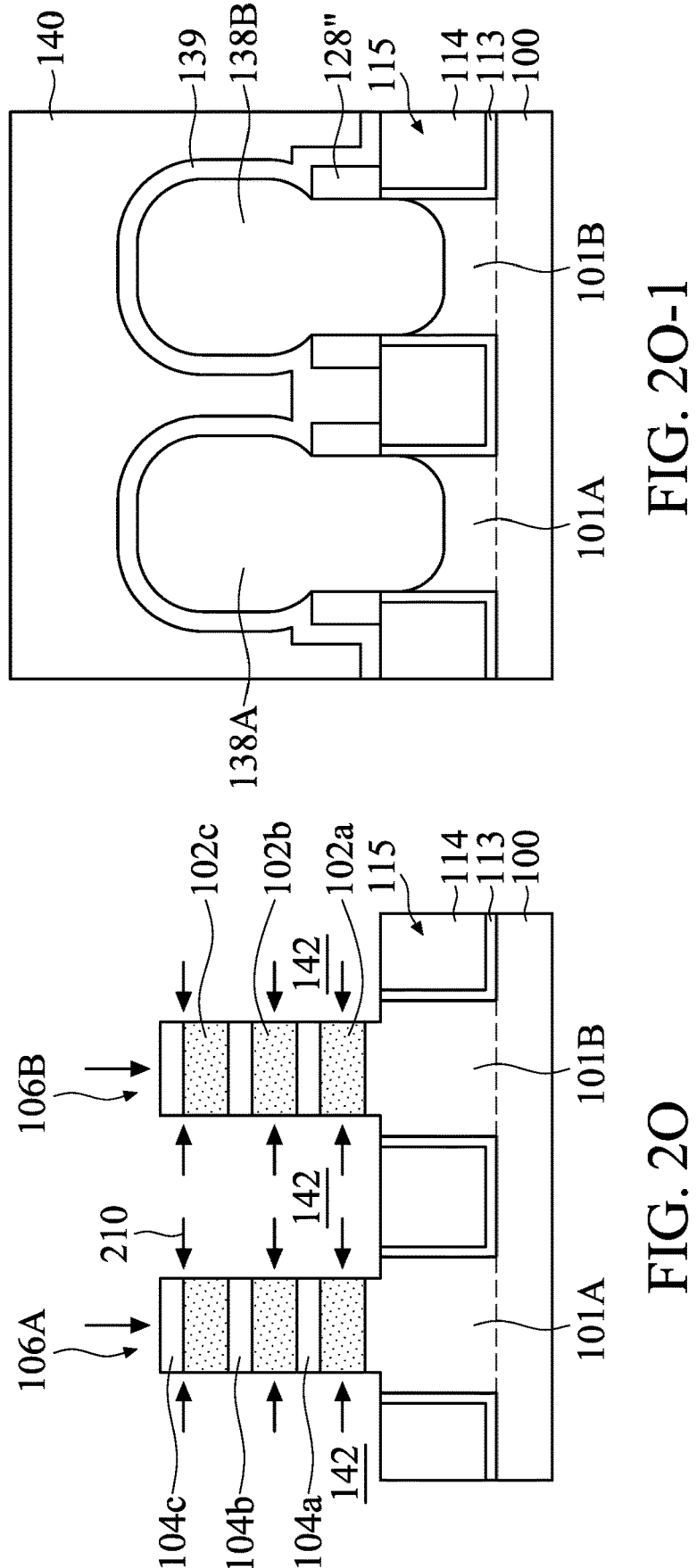
Figures 1, 2P:
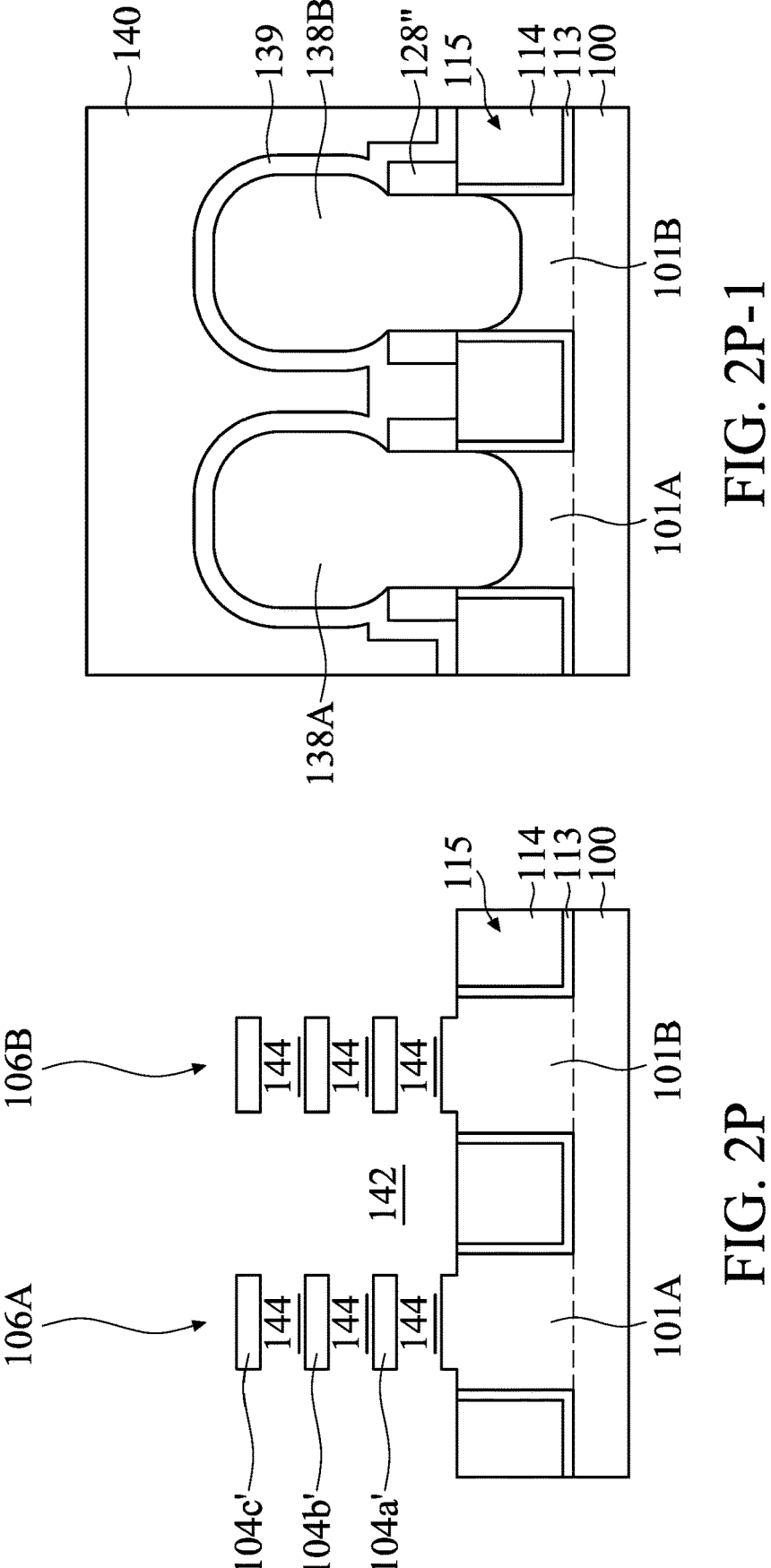
Figures 1, 2Q:
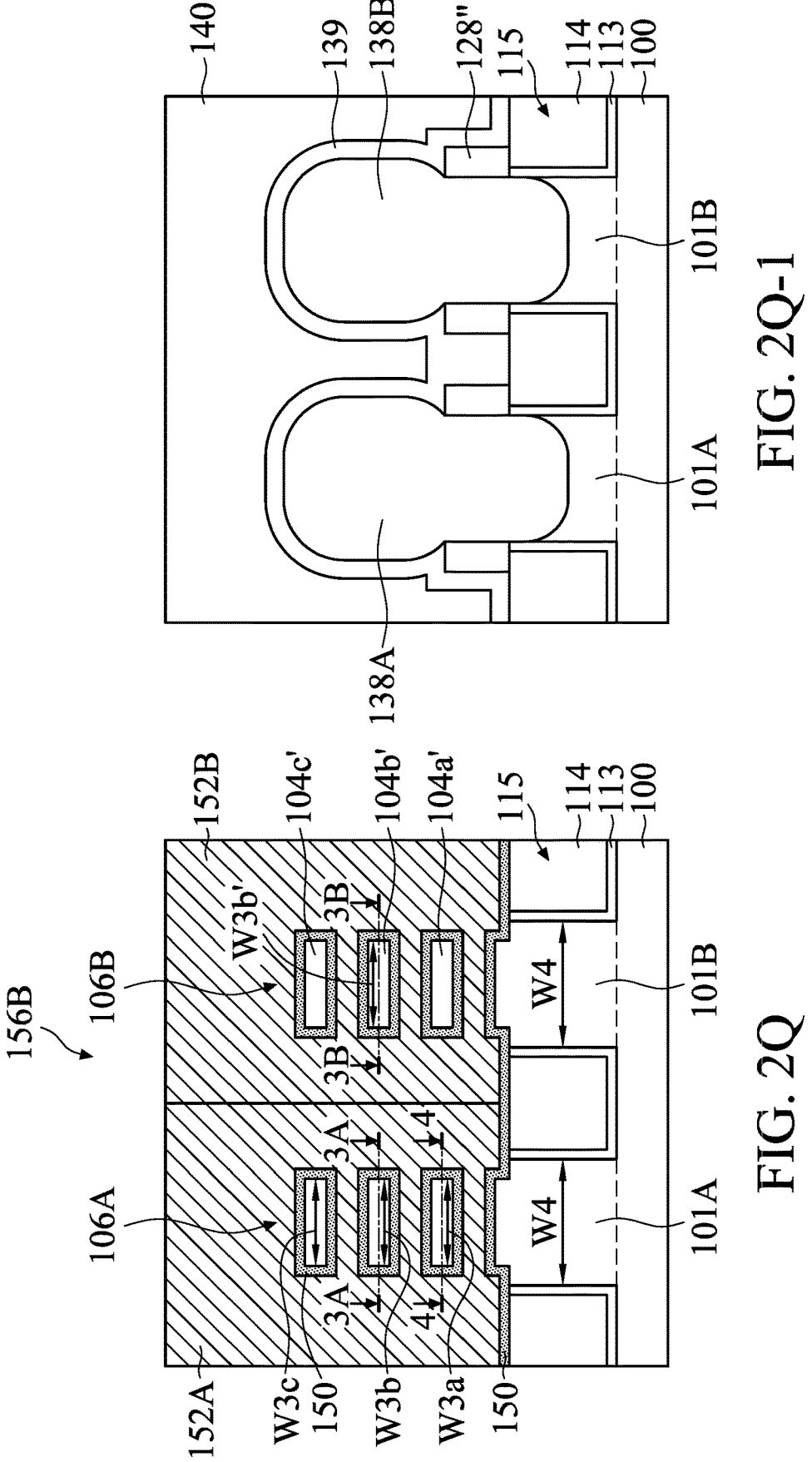
Figures 2, 2Q:
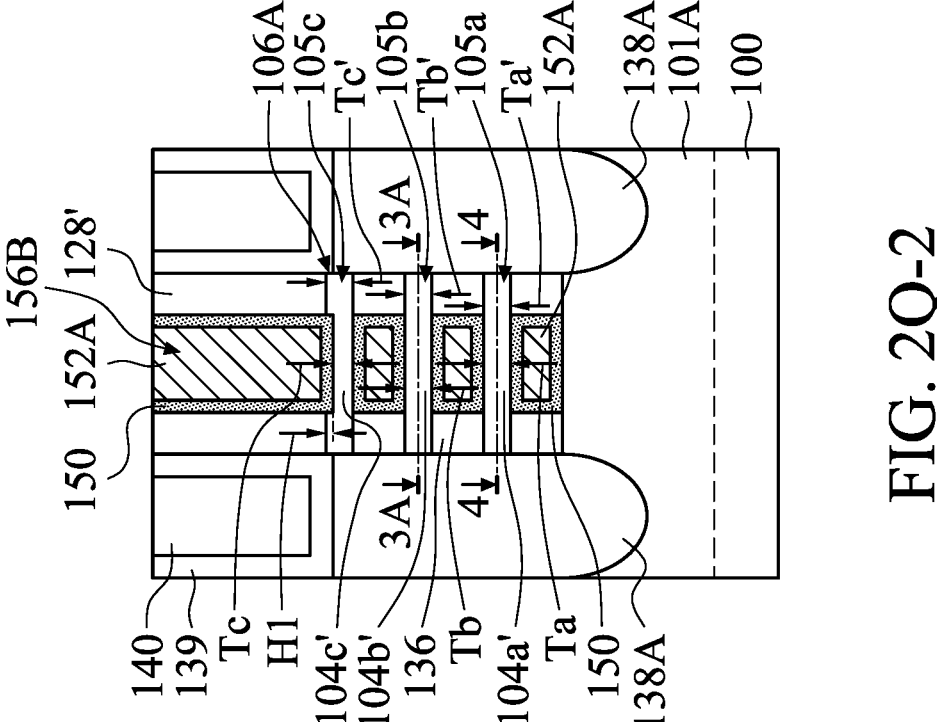

FIGS. 2A-2Q are various cross-sectional views of various stages of a process for forming portions of a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 2A, a semiconductor stack having multiple semiconductor layers is formed over the semiconductor substrate 100, in accordance with some embodiments. In some embodiments, the semiconductor stack includes multiple semiconductor layers 102a, 102b, and 102c. The semiconductor stack also includes multiple semiconductor layers 104a, 104b, and 104c. In some embodiments, the semiconductor layers 102a-102c and the semiconductor layers 104a-104c are laid out in an alternating manner, as shown in FIG. 2A. In some embodiments, the semiconductor layers 102a-102c and 104a-104c together form a superlattice structure. In some embodiments, the topmost semiconductor layer (i.e., the semiconductor layer 104c) is thicker than a lower semiconductor layer, such as the semiconductor layer 104b or 104a.

In some embodiments, the semiconductor layers 102a-102c function as sacrificial layers that will be removed in a subsequent process to release the semiconductor layers 104a-104c. The semiconductor layers 104a-104c that are released form multiple semiconductor nanostructures. The semiconductor nanostructures may function as channel structures of one or more transistors.

In some embodiments, the semiconductor layers 104a-104c that will be used to form channel structures are made of a material that is different than that of the semiconductor layers 102a-102c. In some embodiments, the semiconductor layers 104a-104c are made of or include silicon, germanium, other suitable materials, or a combination thereof. In some embodiments, the semiconductor layers 102a-102c are made of or include silicon germanium. In some other embodiments, the semiconductor layers 104a-104c are made of silicon germanium, and the semiconductor layers 102a-102c are made of silicon germanium with different atomic concentration of germanium than that of the semiconductor layers 104a-104c. Due to the different compositions, different etching selectivity and/or different oxidation rates may be achieved between the semiconductor layers 102a-102c and the semiconductor layers 104a-104c.

The present disclosure contemplates that the semiconductor layers 102a-102c and the semiconductor layers 104a-104c include any combination of semiconductor materials that can provide desired etching selectivity, desired oxidation rate differences, and/or desired performance characteristics (e.g., materials that maximize current flow).

In some embodiments, the semiconductor layers 102a-102c and 104a-104c are formed using multiple epitaxial growth operations. Each of the semiconductor layers 102a-102c and 104a-104c may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the semiconductor layers 102a-102c and 104a-104c are grown in-situ in the same process chamber. In some embodiments, the growth of the semiconductor layers 102a-102c and 104a-104c are alternately and sequentially performed in the same process chamber to complete the formation of the semiconductor stack. In some embodiments, the vacuum of the process chamber is not broken before the epitaxial growth of the semiconductor stack is accomplished.

Afterwards, hard mask elements are formed over the semiconductor stack to assist in a subsequent patterning of the semiconductor stack. Each of the hard mask elements may include a first mask layer 108 and a second mask layer 110. The first mask layer 108 and the second mask layer 110 may be made of different materials. One or more photolithography processes and one or more etching processes are used to pattern the semiconductor stack into multiple fin structures. The fin structures may be patterned by any suitable method. For example, the fin structures may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

The semiconductor stack is partially removed to form multiple fin structures (including fin structures 106A and 106B) and multiple trenches 112, as shown in FIG. 2B. Each of the fin structures 106A-106B may include portions of the semiconductor layers 102a-102c and 104a-104c and multiple semiconductor fins (including semiconductor fins 101A and 101B), as shown in FIG. 2B. The semiconductor substrate 100 may also be partially removed during the etching process that forms the fin structures. Protruding portions of the semiconductor substrate 100 that remain form the semiconductor fins 101A and 101B.

Figure 1B:
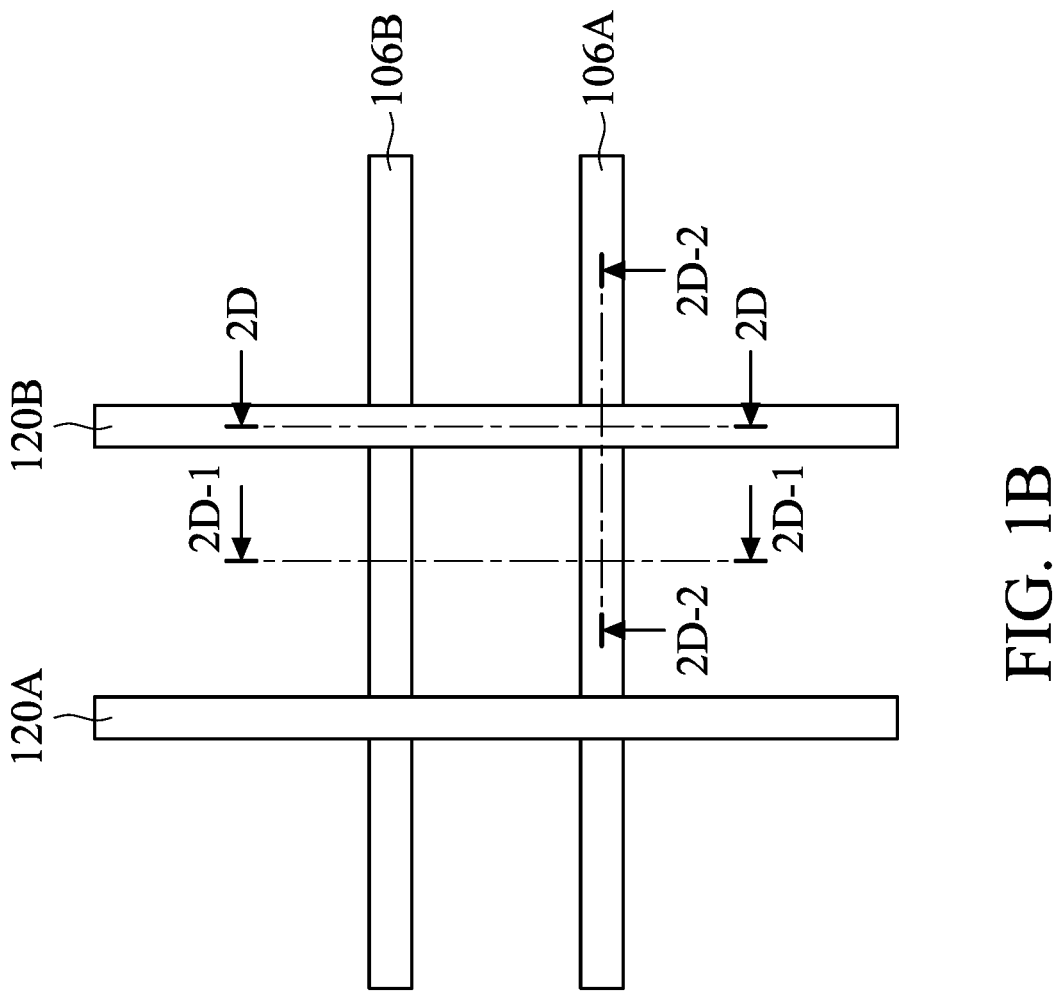

FIGS. 1A-1B are top views of various stages of a process for forming a portion of a semiconductor device structure, in accordance with some embodiments. As shown in FIG. 1A, multiple fin structures 106A and 106B are formed, in accordance with some embodiments. In some embodiments, the fin structures 106A and 106B are oriented lengthwise. In some embodiments, the extending directions of the fin structures 106A and 106B are substantially parallel to each other, as shown in FIG. 1A. In some embodiments, FIG. 2B is a cross-sectional view of the structure taken along the line 2B-2B in FIG. 1A.

Afterwards, as shown in FIG. 2C, an isolation structure 115 is formed to surround lower portions of the fin structures 106A and 106B, in accordance with some embodiments. In some embodiments, the isolation structure 115 includes dielectric fillings 114 and a liner layer 113 that is adjacent to the semiconductor fins 101A and 101B.

In some embodiments, one or more dielectric layers for forming the dielectric fillings 114 are deposited over the fin structures 106A and 106B and the semiconductor substrate 100. The dielectric layers may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The liner layer 113 may be made of or include silicon nitride, silicon oxynitride, silicon carbide, silicon oxycarbide, one or more other suitable materials, or a combination thereof. The dielectric layers and the liner layer 113 may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers and the liner layer 113. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof.

Afterwards, one or more etching back processes are used to partially remove the dielectric layers and the liner layer 113. As a result, the remaining portion of the dielectric layers forms the dielectric fillings 114 of the isolation structure 115. Upper portions of the fin structures 106A and 106B protrude from the top surface of the isolation structure 115, as shown in FIG. 2C.

In some embodiments, the etching back process for forming the isolation structure 115 is carefully controlled to ensure that the topmost surface of the isolation structure 115 is positioned at a suitable height level, as shown in FIG. 2C. In some embodiments, the topmost surface of the isolation structure 115 is below the bottommost surface of the semiconductor layer 102a that functions as a sacrificial layer.

Afterwards, the hard mask elements (including the first mask layer 108 and the second mask layer 110) are removed using an etching process. Alternatively, in some other embodiments, the hard mask elements are removed or consumed during the planarization process and/or the etching back process that forms the isolation structure 115.

Afterwards, dummy gate stacks 120A and 120B are formed to extend across the fin structures 106A and 106B, as shown in FIG. 1B in accordance with some embodiments. In some embodiments, FIG. 2D is a cross-sectional view of the structure taken along the line 2D-2D in FIG. 1B. In some embodiments, FIG. 2D-1 is a cross-sectional view of the structure taken along the line 2D-1 to 2D-1 in FIG. 1B. In some embodiments, FIG. 2D-2 is a cross-sectional view of the structure taken along the line 2D-2 to 2D-2 in FIG. 1B.

As shown in FIGS. 1B, 2D, and 2D-2, the dummy gate stacks 120A and 120B partially cover and extend across the fin structures 106A and 106B, in accordance with some embodiments. In some embodiments, the dummy gate stacks 120A and 120B wraps around the fin structures 106A and 106B. As shown in FIG. 2D, the dummy gate stack 120B extends across and is wrapped around the fin structures 106A and 106B. As shown in FIGS. 1B and 2D-1, other portions of the fin structures 106A and 106B are exposed without being covered by the dummy gate stack 120A or 120B.

As shown in FIGS. 2D and 2D-2, the dummy gate stack 120B includes a dummy gate dielectric layer 116 and a dummy gate electrode 118. The dummy gate dielectric layer 116 may be made of or include silicon oxide or another suitable material. The dummy gate electrodes 118 may be made of or include polysilicon or another suitable material.

In some embodiments, a dummy gate dielectric material layer and a dummy gate electrode layer are sequentially deposited over the isolation structure 115 and the fin structures 106A and 106B. The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form the dummy gate stacks 120A and 120B.

In some embodiments, hard mask elements are used to assist in the patterning process for forming the dummy gate stacks 120A and 120B. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate stacks 120A and 120B.

Afterwards, a gate spacer layer 128 is deposited over the dummy gate stack 120B, the fin structures 106A and 106B, and the isolation structure 115, as shown in FIGS. 2E, 2E-1, and 2E-2 in accordance with some embodiments. In some embodiments, the gate spacer layer 128 is a single layer. In some other embodiments, the gate spacer layer 128 includes multiple sub-layers. The gate spacer layer 128 extends along the tops and sidewalls of the dummy gate stacks 120A and 120B. The gate spacer layer 128 also extends along the tops and sidewalls of the fin structures 106A and 106B, as shown in FIG. 2E-1.

The gate spacer layer 128 may be made of or include silicon nitride, silicon oxynitride, carbon-containing silicon nitride, carbon-containing silicon oxynitride, silicon oxide, carbon-containing silicon oxide, aluminum oxide, hafnium oxide, one or more other suitable materials, or a combination thereof. In some embodiments, one or more sub-layers of the gate spacer layer 128 is/are made of a high-k material. The dielectric constant of the high-k material may be greater than about 7. The gate spacer layer 128 may be deposited using a CVD process, an ALD process, a physical vapor deposition (PVD) process, another applicable process, or a combination thereof.

As shown in FIGS. 2F, 2F-1, and 2F-2, the gate spacer layer 128 are partially removed, in accordance with some embodiments. One or more anisotropic etching processes may be used to partially remove the gate spacer layer 128. As a result, remaining portions of the gate spacer layer 128 form gate spacers 128' and fin spacers 128", as shown in FIGS. 2F-1 and 2F-2. The gate spacers 128' extend along the sidewalls of the dummy gate stack 120B, as shown in FIG. 2F-2.

As shown in FIGS. 2F-1 and 2F-2, the fin structures 106A and 106B are also partially removed, in accordance with some embodiments. As a result, multiple recesses 130 are formed. The recesses 130 may be used to contain epitaxial structures (such as source/drain structures) that will be formed later. Source/drain structures (or region(s)) may refer to a source or a drain, individually or collectively dependent upon the context. In some embodiments, the recesses 130 formed in the fin structure 106A are used for containing n-type doped epitaxial structures that will be formed later. In some embodiments, the recesses 130 formed in the fin structure 106B are used for containing p-type doped epitaxial structures that will be formed later.

One or more etching processes may be used to form the recesses 130. In some embodiments, a dry etching process is used to form the recesses 130. Alternatively, a wet etching process may be used to form the recesses 130. The recesses 130 penetrate into the fin structures 106A and 106B. In some embodiments, the recesses 130 further extend into the semiconductor fins 101A and 101B, as shown in FIGS. 2F-1 and 2F-2.

In some embodiments, the recesses 130 have substantially vertical sidewalls. In these cases, due to the profile of the recesses 130, an upper semiconductor layer (such as the semiconductor layer 104c) is substantially as wide as a lower semiconductor layer (such as the semiconductor layer 104b).

However, embodiments of the disclosure have many variations. In some other embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer 104c) is shorter than a lower semiconductor layer (such as the semiconductor layer 104b).

Afterwards, as shown in FIG. 2G-2, the semiconductor layers 102a-102c are laterally etched, in accordance with some embodiments. As a result, edges of the semiconductor layers 102a-102c retreat from edges of the semiconductor layers 104a-104c. As shown in FIG. 2G-2, recesses are formed due to the lateral etching of the semiconductor layers 102a-102c. The recesses may be used to contain inner spacers that will be formed later. The semiconductor layers 102a-102c may be laterally etched using a wet etching process, a dry etching process, or a combination thereof. In some other embodiments, the semiconductor layers 102a-102c are partially oxidized before being laterally etched.

Afterwards, as shown in FIGS. 2G, 2G-1, and 2G-2, an insulating layer 134 is deposited over the structure shown in FIGS. 2F, 2F-1, and 2F-2, in accordance with some embodiments. The insulating layer 134 covers the dummy gate stack 120B and fills the recesses formed beside the semiconductor layers 102a-102c. The insulating layer 134 may be made of or include carbon-containing silicon nitride (SiCN), carbon-containing silicon oxynitride (SiOCN), carbon-containing silicon oxide (SiOC), silicon oxide, silicon nitride, aluminum oxide, hafnium oxide, one or more other suitable materials, or a combination thereof. In some embodiments, the insulating layer 134 is a single layer. In some other embodiments, the insulating layer 134 includes multiple sub-layers. Some of the sub-layers may be made of different materials and/or contain different compositions. The insulating layer 134 may be deposited using a CVD process, an ALD process, one or more other applicable processes, or a combination thereof.

Afterwards, one or more etching processes are used to partially remove the insulating layer 134, as shown in FIGS. 2H, 2H-1, and 2H-2 in accordance with some embodiments. The portions of the insulating layer 134 outside of the recesses may be removed. The remaining portions of the insulating layer 134 form multiple inner spacers 136, as shown in FIG. 2H-2. The etching process may include a dry etching process, a wet etching process, or a combination thereof. In some embodiments, the compositions of the inner spacers 136 and the gate spacers 128' are different, so as to provide etching selectivity between the inner spacers 136 and the gate spacers 128'.

In some embodiments, after the etching process for forming the inner spacers 136, portions of the semiconductor fins 101A and 101B originally covered by the insulating layer 134 are exposed by the recesses 130, as shown in FIGS. 2H-1 and 2H-2. The edges of the semiconductor layers 104a-104c are exposed by the recesses 130, as shown in FIG. 2H-2. The inner spacers 136 cover the edges of the semiconductor layers 102a-102c. The inner spacers 136 may be used to prevent subsequently formed epitaxial structures (which function as, for example, source/drain structures) from being damaged during a subsequent process for removing the semiconductor layers 102a-102c. In some embodiments, the inner spacers 136 are made of a low-k material that has a lower dielectric constant than that of silicon oxide. In these cases, the inner spacers 136 may also be used to reduce parasitic capacitance between the subsequently formed source/drain structures and the gate stacks. As a result, the operation speed of the semiconductor device structure may be improved.

As shown in FIGS. 2I-1, a mask element 202 and a patterned photoresist layer 204 are formed to cover the semiconductor fin 101B, in accordance with some embodiments. The semiconductor fin 101B is not covered by the patterned photoresist layer 204, as shown in FIG. 2I-1. Afterwards, with the patterned photoresist layer 204 as an etching mask, the mask element 202 may be partially removed such that the semiconductor fin 101A underneath is exposed. Then, the patterned photoresist layer 204 may be removed.

Afterwards, as shown in FIGS. 2J-1 and 2J-2, epitaxial structure 138A are formed on the side surfaces of semiconductor layers 104a-104c and the semiconductor fin 101A, in accordance with some embodiments. In some embodiments, the epitaxial structures 138A fill the recesses 130 that are not covered by the mask element 202. In some embodiments, the epitaxial structures 138A overfill the recesses 130 to ensure fully contact between the epitaxial structures 138A and the side surfaces of the semiconductor layer 104c nearby. In some embodiments, the top surfaces of the epitaxial structures 138A are higher than the top surface of the dummy gate dielectric layer 116. In some other embodiments, the epitaxial structures 138A partially fill the recesses 130. After the formation of the epitaxial structures 138A, the remaining portion of the mask element 202 is removed.

In some embodiments, the epitaxial structures 138A connect to some of the semiconductor layers 104a-104c. Some of the semiconductor layers 104a-104c are sandwiched between the epitaxial structures 138A. In some embodiments, the epitaxial structures 138A are n-type doped epitaxial structures. The epitaxial structures 138A may include epitaxially grown silicon, epitaxially grown silicon germanium (SiGe), or another suitable epitaxially grown semiconductor material.

In some embodiments, the epitaxial structures 138A are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the formation of the epitaxial structures 138A involves one or more etching processes that are used to fine-tune the shapes of the epitaxial structures 138A.

In some embodiments, the epitaxial structures 138A are doped with one or more suitable n-type dopants. For example, the epitaxial structures 138A are Si source/drain features that are doped with phosphor (P), antimony (Sb), arsenic (As) or another suitable dopant. In some embodiments, each of the epitaxial structures 138A has a first region and a second region over the first region. The second region may have a greater dopant concentration than that of the first region.

In some embodiments, the epitaxial structures 138A are doped in-situ during their epitaxial growth. The initial reaction gas mixture for forming the epitaxial structures 138A contains dopants. In some other embodiments, the epitaxial structures 138A are not doped during the growth of the epitaxial structures 138A. Instead, after the formation of the epitaxial structures 138A, the epitaxial structures 138A are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138A are further exposed to one or more annealing processes to activate the dopants. For example, a rapid thermal annealing process is used.

As shown in FIG. 2K-1, after the removal of the mask element 202, a mask element 206 and a patterned photoresist layer 208 is formed to cover the epitaxial structures 138A, in accordance with some embodiments. The pattern photoresist layer 208 is formed to assist in the patterning of the mask element 206. Afterwards, with the pattern photoresist layer 208 as an etching mask, the mask element 206 is partially removed. As a result, the semiconductor fin 101B is exposed. Then, the pattern photoresist layer 208 is removed. The epitaxial structures 138A remain covered by the mask element 206.

Afterwards, as shown in FIG. 2L-1, epitaxial structures 138B are formed on the semiconductor fin 101B, in accordance with some embodiments. In some embodiments, the epitaxial structures 138B fill the recesses 130 that are not covered by the mask element 206. In some other embodiments, the epitaxial structures 138B overfill the recesses 130 to ensure fully contact between the epitaxial structures 138B and the side surfaces of the semiconductor layer 104c nearby. In some embodiments, the top surfaces of the epitaxial structures 138B are higher than the top surface of the dummy gate dielectric layer 116. In some other embodiments, the epitaxial structures 138B partially fill the recesses 130.

In some embodiments, similar to the structure shown in FIG. 2J-2, the epitaxial structures 138B connect to some of the semiconductor layers 104a-104c. Some of the semiconductor layers 104a-104c are sandwiched between the epitaxial structures 138B. In some embodiments, the epitaxial structures 138B are p-type doped epitaxial structures. The epitaxial structures 138B may include epitaxially grown silicon germanium, epitaxially grown silicon, or another suitable epitaxially grown semiconductor material.

In some embodiments, the epitaxial structures 138B are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the formation of the epitaxial structures 138B involves one or more etching processes that are used to fine-tune the shapes of the epitaxial structures 138B. After the formation of the epitaxial structures 138B, the remaining portion of the mask element 206 is removed.

In some embodiments, the epitaxial structures 138B are doped with one or more suitable p-type dopants. For example, the epitaxial structures 138B are SiGe source/drain features or Si source/drain features that are doped with boron (B), gallium (Ga), indium (In), or another suitable dopant. In some embodiments, each of the epitaxial structures 138B has a first region and a second region over the first region. The second region may have a greater dopant concentration than that of the first region.

In some embodiments, the epitaxial structures 138B are doped in-situ during their epitaxial growth. The initial reaction gas mixture for forming the epitaxial structures 138B contains dopants. In some other embodiments, the epitaxial structures 138B are not doped during the growth of the epitaxial structures 138B. Instead, after the formation of the epitaxial structures 138B, the epitaxial structures 138B are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138B are further exposed to one or more annealing processes to activate the dopants. For example, a rapid thermal annealing process is used.

In some embodiments illustrated in FIGS. 2J-2L, the epitaxial structures 138A are formed before the epitaxial structures 138B. However, embodiments of the disclosure are not limited thereto. Many variations and/or modifications can be made to embodiments of the disclosure. In some other embodiments, the epitaxial structures 138B are formed before the epitaxial structures 138A.

As shown in FIG. 2M-1, a contact etch stop layer 139 and a dielectric layer 140 are formed over the epitaxial structures 138A and 138B, in accordance with some embodiments. In some embodiments, the contact etch stop layer 139 and the dielectric layer 140 also laterally surround the dummy gate stacks 120A and 120B. The contact etch stop layer 139 may be made of or include silicon nitride, silicon oxynitride, silicon carbide, aluminum oxide, another suitable material, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof.

In some embodiments, an etch stop material layer and a dielectric material layer are sequentially deposited. The etch stop material layer may be deposited using a CVD process, an ALD process, a PVD process, one or more other applicable processes, or a combination thereof. The dielectric material layer may be deposited using an FCVD process, a CVD process, an ALD process, another applicable process, or a combination thereof.

Afterwards, a planarization process is used to partially remove the etch stop material layer and the dielectric material layer. As a result, the remaining portions of the etch stop material layer and the dielectric material layer respectively form the contact etch stop layer 139 and the dielectric layer 140, as shown in FIG. 2M-1. The planarization process may include a CMP process, a grinding process, an etching process, a dry polishing process, one or more other applicable processes, or a combination thereof. In some embodiments, the mask elements used for defining the dummy gate stacks 120A and 120B are removed during the planarization process. In some embodiments, after the planarization process, the top surfaces of the contact etch stop layer 139, the dielectric layer 140, and the dummy gate electrodes 118 are substantially level.

Afterwards, as shown in FIG. 2N, the dummy gate electrodes 118 and the dummy gate dielectric layer 116 are removed to form trenches 142 using one or more etching processes, in accordance with some embodiments. As shown in FIG. 2N-1, the epitaxial structures 138A and 138B remain covered by the etch stop layer 139 and the dielectric layer 140. The trenches 142 are surrounded by the dielectric layer 140. The trenches 142 expose the fin structures 106A and 106B.

As shown in FIG. 2O, an etching process 210 is used to trim the exposed portions of the fin structures 106A and 106B that are exposed by the trench 142, in accordance with some embodiments. In some embodiments, the exposed portions of the fin structures 106A and 106B becomes narrower. In some embodiments, the semiconductor layer 104c becomes thinner. In some embodiments, portions of the semiconductor layer 104a-104c are covered and surrounded by the gate spacers 128' and the inner spacers 136, and are thus not trimmed by the etching process 210. The epitaxial structures 138A and 138B are also not trimmed by the etching process 210 since they are covered and protected by the dielectric layer 140.

As shown in FIG. 2P, the semiconductor layers 102a-102c (which function as sacrificial layers) are then removed, in accordance with some embodiments. In some embodiments, one or more etching processes are used to remove the semiconductor layers 102a-102c. As a result, recesses 144 are formed, as shown in FIG. 2P.

Due to high etching selectivity, the semiconductor layers 104a-104c are slightly (or substantially not) etched. The remaining portions of the semiconductor layers 104a-104c form multiple semiconductor nanostructures 104a'-104c'. The semiconductor nanostructures 104a'-104c' are constructed by or made up of the remaining portions of the semiconductor layers 104a-104c. The semiconductor nanostructures 104a'-104c' suspended over the semiconductor fins 101A and 101B may function as channel structures of transistors.

After the removal of the semiconductor layers 102a-102c (which function as sacrificial layers), the recesses 144 are formed. The recesses 144 connect to the trench 142 and surround each of the semiconductor nanostructures 104a'-104c'. Even if the recesses 144 between the semiconductor nanostructures 104a'-104c' are formed, the semiconductor nanostructures 104a'-104c' remain held by the epitaxial structures 138A or 138B. Therefore, after the removal of the semiconductor layers 102a-102c (which function as sacrificial layers), the released semiconductor nanostructures 104a'-104c' are prevented from falling.

During the removal of the semiconductor layers 102a-102c (which function as sacrificial layers), the inner spacers 136 protect the epitaxial structures 138A and 138B from being etched or damaged. The quality and reliability of the semiconductor device structure are improved.

As shown in FIGS. 2Q and 2Q-2, a metal gate stacks 156B is formed to fill the trenches 142, in accordance with some embodiments. The metal gate stack 156B further extend into the recesses 144 to wrap around each of the semiconductor nanostructures 104a'-104c'.

The metal gate stack 156B includes multiple metal gate stack layers. The metal gate stack 156B may include a gate dielectric layer 150 and metal gate electrodes 152A and 152B. Each of the metal gate electrodes 152A and 152B may include a work function layer. Each of the metal gate electrodes 152A and 152B may further include a conductive filling. In some embodiments, the formation of the metal gate stack 156B involves the deposition of multiple metal gate stack layers over the dielectric layer 140 to fill the trenches 142 and the recesses 144. The metal gate stack layers extend into the recesses 144 to wrap around each of the semiconductor nanostructures 104a'-104c'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, an interfacial layers are formed on the surfaces of the semiconductor nanostructures 104a'-104c'. The interfacial layers are very thin and are made of, for example, silicon oxide or germanium oxide. In some embodiments, the interfacial layers are formed by applying an oxidizing agent on the surfaces of the semiconductor nanostructures 104a'-104c'. For example, a hydrogen peroxide-containing liquid may be applied or provided on the surfaces of the semiconductor nanostructures 104a'-104c' so as to form the interfacial layers.

The work function layer of the metal gate electrodes 152A and 152B may be used to provide the desired work function for transistors to enhance device performance including improved threshold voltage. The metal gate electrodes 152A and 152B may have different work function layers. In some embodiments, the work function layer surrounding the semiconductor nanostructures 104a'-104c' of the fin structure 106B is used for forming a PMOS device. In these cases, the work function layer of the metal gate electrode 152B is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

In some embodiments, the work function layer surrounding the semiconductor nanostructures 104a'-104c' of the fin structure 106A is used for forming an NMOS device. The work function layer of the metal gate electrode 152A is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 150 using an ALD process, a CVD process, a PVD process, an electroplating process, an electroless plating process, one or more other applicable processes, or a combination thereof. In some embodiments, the formation of the work function layer involves one or more patterning processes. As a result, the n-type work function layer and the p-type work function layer are selectively formed over different regions.

In some embodiments, a barrier layer is formed before the work function layer to interface the gate dielectric layer 150 with the subsequently formed work function layer. The barrier layer may also be used to prevent diffusion between the gate dielectric layer 150 and the subsequently formed work function layer. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive fillings of the metal gate electrodes 152A and 152B are made of or include a metal material. The metal material may include tungsten, aluminum, copper, cobalt, one or more other suitable materials, or a combination thereof. A conductive layer used for forming the conductive filling may be deposited over the work function layer using a CVD process, an ALD process, a PVD process, an electroplating process, an electroless plating process, a spin coating process, one or more other applicable processes, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Many variations and/or modifications can be made to embodiments of the disclosure. In some other embodiments, the entirety of the metal gate electrode 152A is made of an n-type work function layer, and the entirety of the metal gate electrode 152B is made of a p-type work function layer.

Afterwards, a planarization process is performed to remove the portions of the metal gate stack layers outside of the trenches 142, in accordance with some embodiments. As a result, the remaining portions of the metal gate stack layers form the metal gate stack 156B, as shown in FIGS. 2Q and 2Q-2. During the formation of the metal gate stack 156B, the epitaxial structures 138A and 138B are covered and protected by the dielectric layer 140, as shown in FIG. 2Q-1.

As shown in FIG. 2Q, the semiconductor nanostructures 104a'-104c' of the fin structure 106A have widths W3a, W3b, and W3c, respectively. Each of the widths W3a, W3b, and W3c may be measured along the lengthwise axis of the metal gate stack 156B. As shown in FIG. 2Q, the semiconductor nanostructures 104b' of the fin structure 106B has a width W3b' that is measured along the lengthwise axis of the metal gate stack 156B. As shown in FIG. 2Q, the semiconductor fin 101A or 101B has a width W4 that is measured along the lengthwise axis of the metal gate stack 156B. In some embodiments, the width W4 is greater than the width W3a, W3b, W3c, or W3b'. The difference between the width W4 and the width W3a, W3b, W3c, or W3b' may be within a range from about 1 nm to about 20 nm. Because the semiconductor fin 101A or 101B is wider, the bending of the fin structure 106A or 106B may be mitigated.

As shown in FIG. 2Q-2, the semiconductor nanostructures 104a'-104c' have intermediate portions (or trimmed portions) with thicknesses Ta, Tb, and Tc, respectively. The semiconductor nanostructures 104a'-104c' also have edge portions 105a, 105b, and 105c that are adjacent to the respective intermediate portions of the semiconductor nanostructures 104a'-104c'. The edge portions 105a-105c have thicknesses Ta', Tb', and Tc', respectively. In some embodiments, the thicknesses Ta, Ta', Tb, and Tb' are substantially equal to each other.

In some embodiments, the thickness Tc' is greater than the thickness Tc, as shown in FIG. 2Q-2. In some embodiments, the edge portion 105c protrudes from the top surface of the intermediate portion of the semiconductor nanostructure 104c' by a distance H1. In some embodiments, the top of the edge portion 105c is positioned at a higher height level than the top of the intermediate portion of the semiconductor nanostructure 104c'. In some embodiments, the bottoms of the edge portion 105c and the intermediate portion of the semiconductor nanostructure 104c' are substantially level.

Figure 5:
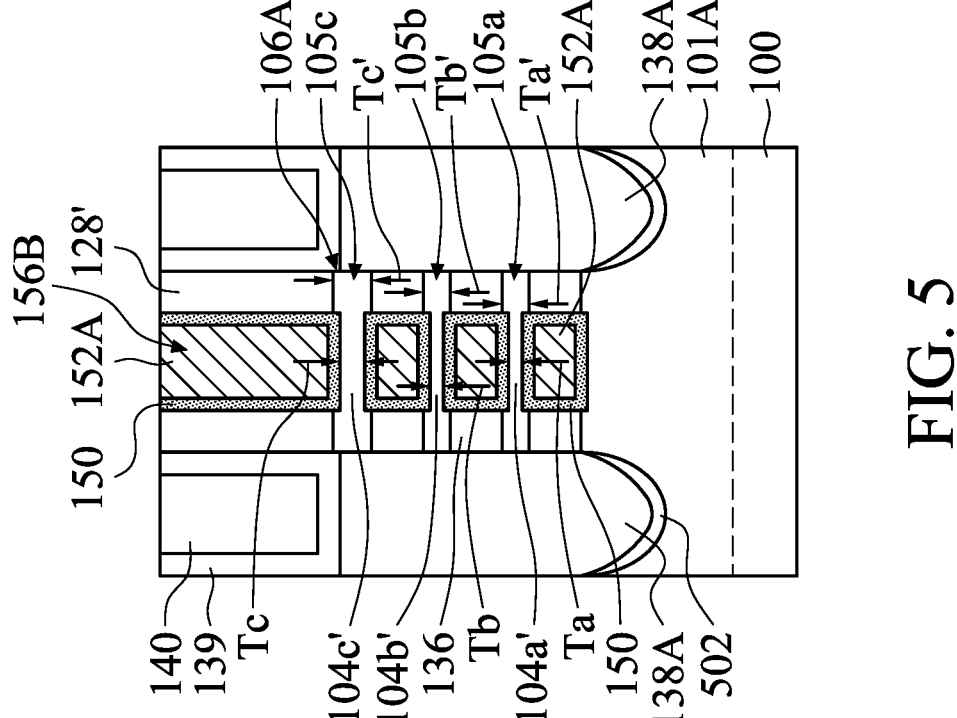
FIG. 5 is a cross-sectional view of a stage of a process for forming a portion of a semiconductor device structure, in accordance with some embodiments.

FIG. 5 is a cross-sectional view of a stage of a process for forming a portion of a semiconductor device structure, in accordance with some embodiments. As shown in FIG. 5, a structure that is similar to the structure shown in FIG. 2Q-2 is formed. The profile of the semiconductor nanostructures 104a'-104c' may be fine-tuned using the etching process illustrated in FIGS. 2O and/or 2P. In some embodiments, each of the edge portions 105a-105c is thicker than the respective intermediate portion of the semiconductor nanostructures 104a'-104c'. The thickness difference between the edge portions 105a-105c and the respective intermediate portion of the semiconductor nanostructures 104a'-104c' may be within a range from about 1 nm to about 10 nm.

In some embodiments, the topmost semiconductor nanostructure (i.e., the semiconductor nanostructure 104c') has the greatest thickness difference between the edge portion 105c and the intermediate portion of the semiconductor nanostructure 104c'. That is, the thickness difference (Tc'–Tc) between the thicknesses Tc' and Tc is greater than the thickness difference (Tb'–Tb) between the thicknesses Tb' and Tb or the thickness difference (Ta'–Ta) between thicknesses Ta' and Ta.

In some embodiments, the thickness Tc is greater than the thickness Tb or Ta. The thickness difference between the thickness Tc and the thickness Tb or Ta may be within a range from about 0.5 nm to about 3 nm. In some embodiments, the thickness Tc' is greater than the thickness Tb' or Ta'. The thickness difference between the thickness Tc' and the thickness Tb' or Ta' may be within a range from about 0.5 nm to about 3 nm. The semiconductor nanostructure 104c' with the greater thicknesses Tc and Tc' may help to provide larger current. The performance and reliability of the semiconductor device structure may be improved.

Many variations and/or modifications can be made to embodiments of the disclosure. In some embodiments, bottom isolation structures 502 are formed between the epitaxial structures 138A and the semiconductor fin 101A. The bottom isolation structures 502 may help to reduce the leakage current or prevent leakage current from the epitaxial structures 138A. The bottom isolation structures 502 may be a single layer or include multiple sub-layers. The bottom isolation structures 502 may be made of or include silicon nitride, silicon oxide, silicon oxynitride, carbon-containing silicon oxynitride, carbon-containing silicon oxide, hafnium oxide, aluminum oxide, one or more another suitable material, or a combination thereof.

Figure 3A:
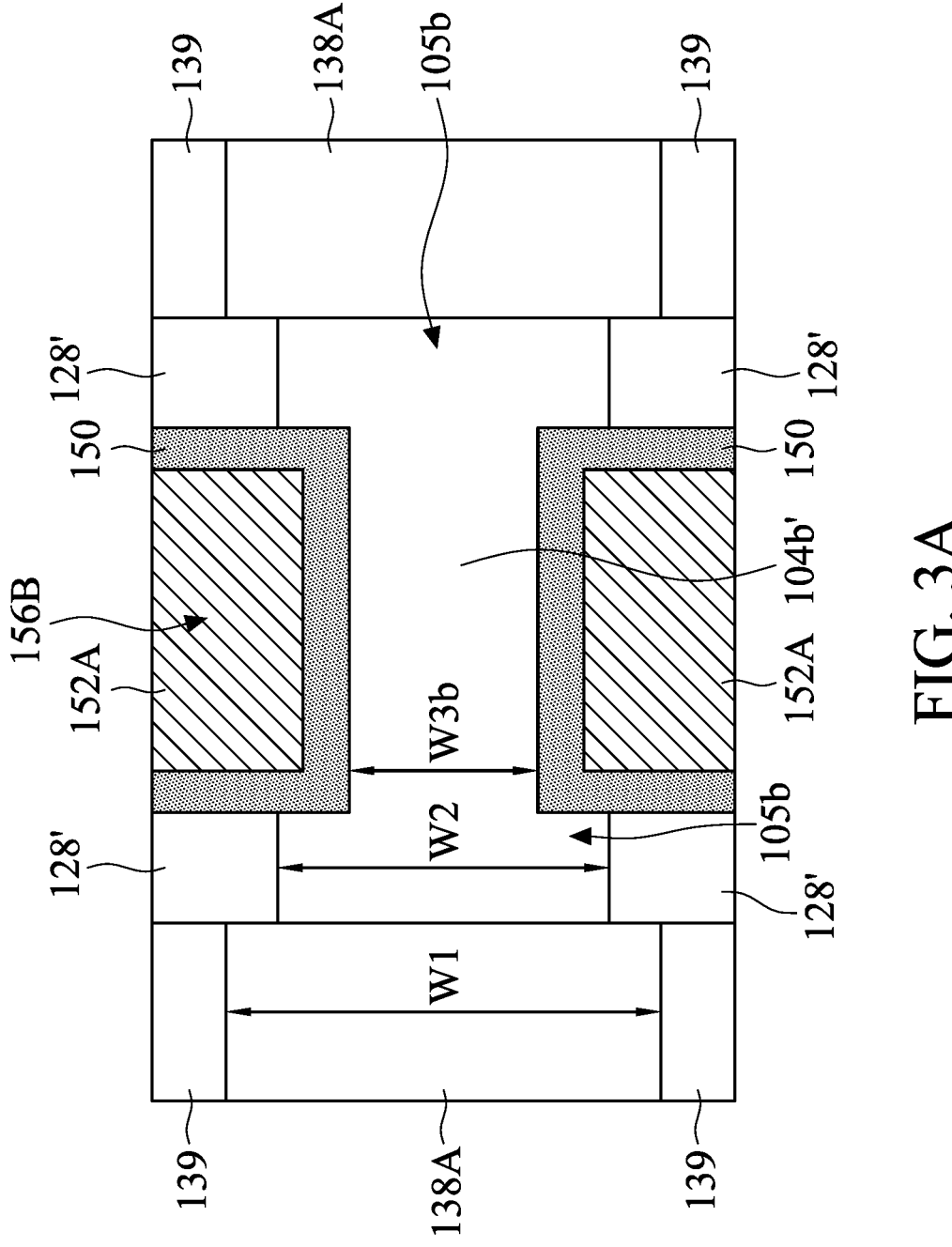
FIGS. 3A and 3B are various cross-sectional views of a stage of a process for forming portions of a semiconductor device structure, in accordance with some embodiments.
Figure 3B:
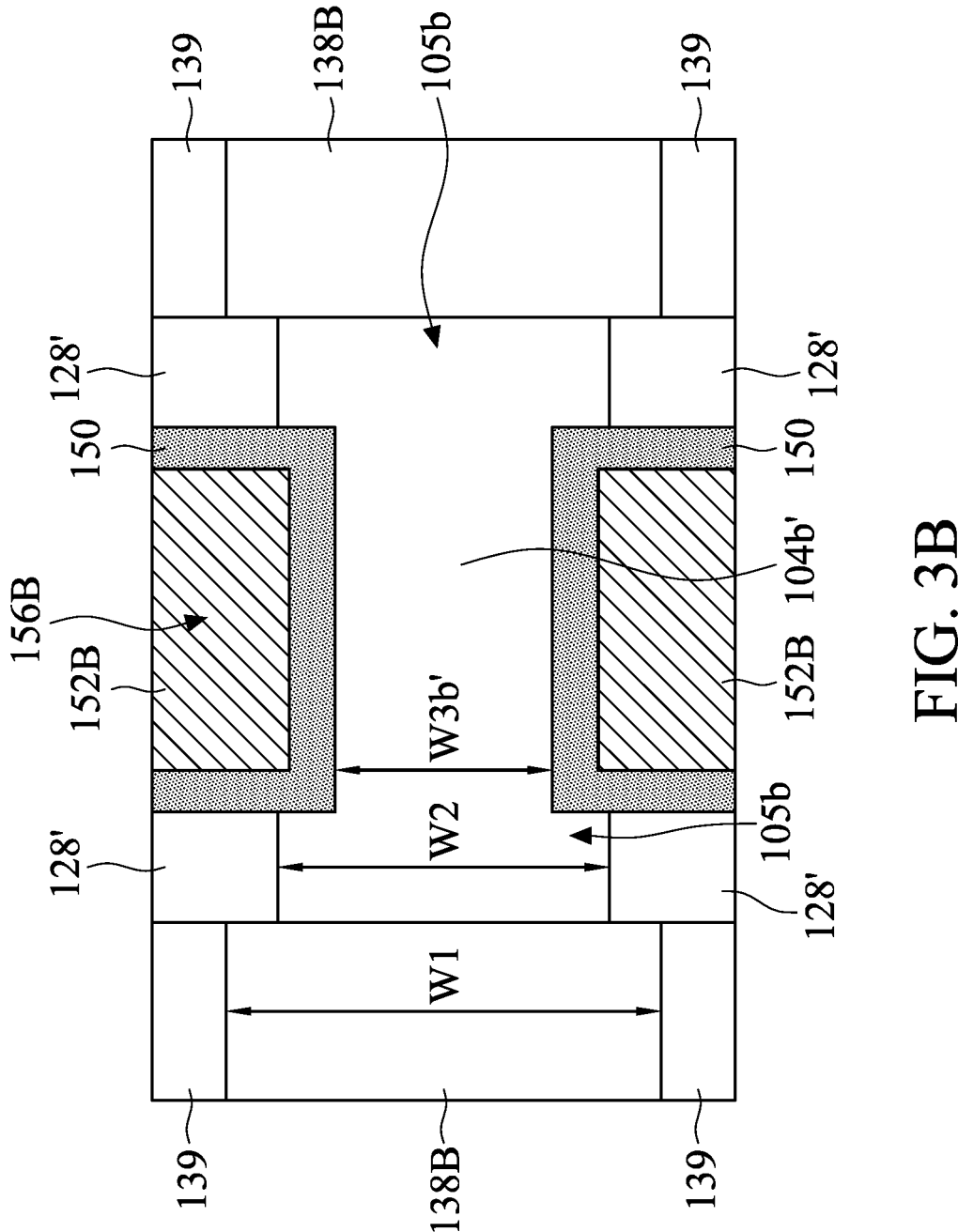
Figure 4:
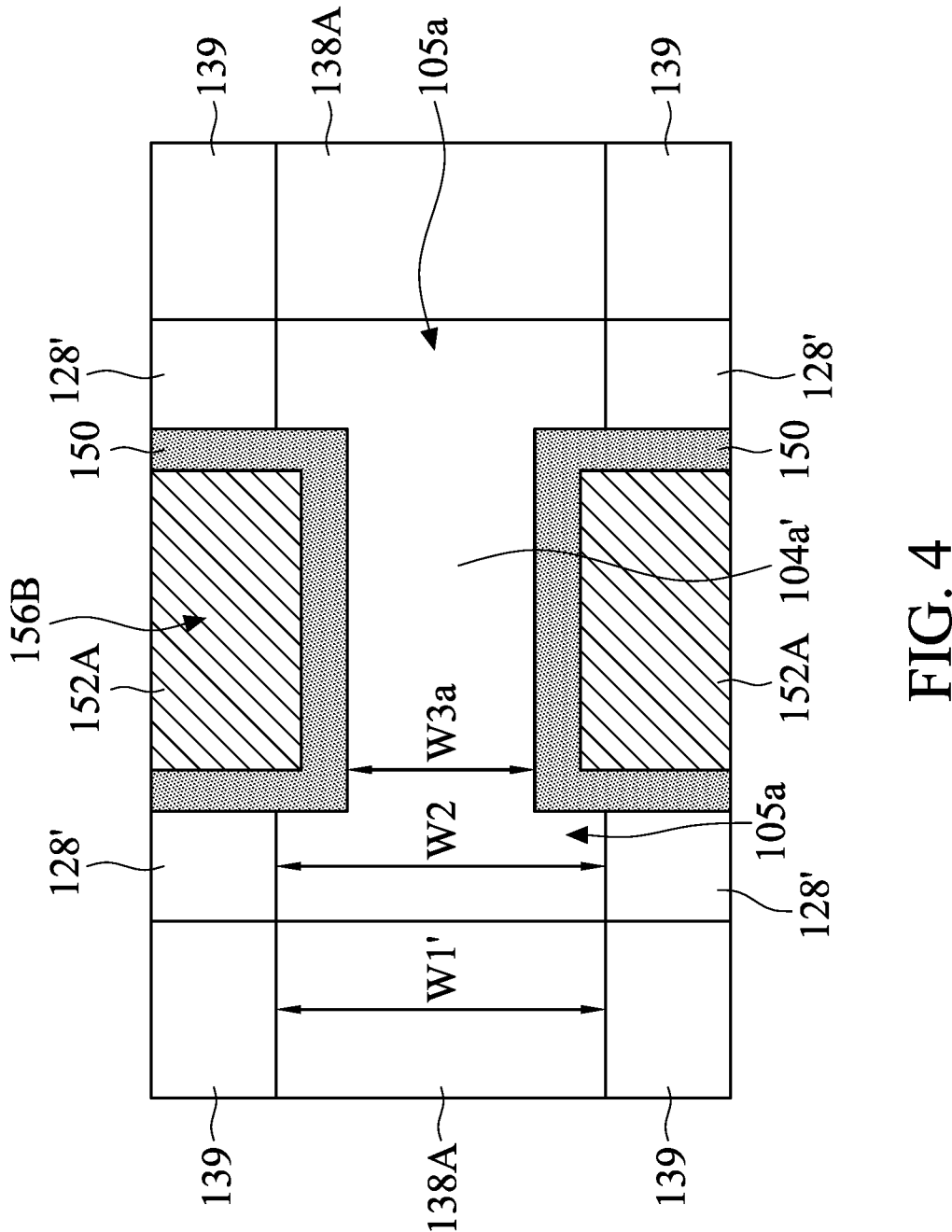
FIG. 4 is a cross-sectional view of a stage of a process for forming a portion of a semiconductor device structure, in accordance with some embodiments.

FIGS. 3A, 3B, and 4 are various cross-sectional views of a stage of a process for forming portions of a semiconductor device structure, in accordance with some embodiments. In some embodiments, FIG. 3A is a cross-sectional view of the structure taken along the line 3A-3A in FIG. 2Q and the line 3A-3A in FIG. 2Q-2. In some embodiments, FIG. 3B is a cross-sectional view of the structure taken along the line 3B-3B in FIG. 2Q. In some embodiments, FIG. 4 is a cross-sectional view of the structure taken along the line 4-4 in FIG. 2Q and the line 4-4 in FIG. 2Q-2. In some embodiments, FIGS. 3A, 3B, and 4 are cross-sectional views that are taken along planes that are parallel to the main surface of the semiconductor substrate 100.

As shown in FIGS. 2Q and 3A, the semiconductor nanostructure 104b' of the fin structure 106A has an intermediate portion and edge portions 105b that are adjacent to the intermediate portion of the semiconductor nanostructure 104b'. The intermediate portion of the semiconductor nanostructure 104b' has the width W3b that is measured along the lengthwise axis of the metal gate stack 156B. As shown in FIG. 3A, each of the edge portions 105b has a width W2 that is measured along the lengthwise axis of the metal gate stack 156B. In some embodiments, the width W2 is greater than the width W3b. The width difference (W2–W3b) between the widths W2 and W3b may be within a range from about 1 nm to about 10 nm.

As shown in FIG. 3A, each of the epitaxial structures 138A has a width W1 that is measured along the lengthwise axis of the metal gate stack 156B. In some embodiments, the width W1 is greater than the width W2. Because the epitaxial structures 138A is wider than the edge portion 105b, the parasitic resistance may be reduced. The width difference (W1–W2) between the widths W1 and W2 may be within a range from about 1 nm to about 60 nm.

Due to the profile of the semiconductor nanostructure 104b', the metal gate stack 156B may create partial charge inversion regions in the edge portions 105b. The current spreading within the semiconductor nanostructure 104b' may be improved. The resistance may thus be reduced. The performance and reliability of the semiconductor device structure are greatly improved.

As shown in FIGS. 2Q and 3B, the semiconductor nanostructure 104b' of the fin structure 106B has an intermediate portion and edge portions 105b that are adjacent to the intermediate portion of the semiconductor nanostructure 104b'. The intermediate portion of the semiconductor nanostructure 104b' has the width W3b' that is measured along the lengthwise axis of the metal gate stack 156B. In some embodiments, the width W3b' is greater than the width W3b illustrated in FIG. 3A.

As shown in FIG. 3B, each of the edge portions 105b has a width W2 that is measured along the lengthwise axis of the metal gate stack 156B. In some embodiments, the width W2 is greater than the width W3b'. The width difference (W2–W3b') between the widths W2 and W3b' may be within a range from about 1 nm to about 10 nm. In some embodiments, the width difference (W2–W3b) illustrated in FIG. 3A is greater than the width difference (W2–W3b') illustrated in FIG. 3B.

As shown in FIG. 3B, each of the epitaxial structures 138B has a width W1 that is measured along the lengthwise axis of the metal gate stack 156B. In some embodiments, the width W1 is greater than the width W2. Because the epitaxial structures 138B is wider than the edge portion 105b, the parasitic resistance may be reduced. The width difference (W1–W2) between the widths W1 and W2 may be within a range from about 1 nm to about 60 nm.

As shown in FIGS. 2Q and 4, the semiconductor nanostructure 104a' has an intermediate portion and edge portions 105a that are adjacent to the intermediate portion of the semiconductor nanostructure 104a'. The intermediate portion of the semiconductor nanostructure 104a' has the width W3a that is measured along the lengthwise axis of the metal gate stack 156B.

As shown in FIG. 4, each of the edge portions 105b has a width W2 that is measured along the lengthwise axis of the metal gate stack 156B. In some embodiments, the width W2 is greater than the width W3a. The width difference (W2–W3a) between the widths W2 and W3a may be within a range from about 1 nm to about 10 nm.

As shown in FIG. 4, each of the epitaxial structures 138A has a width W1 that is measured along the lengthwise axis of the metal gate stack 156B. In some embodiments, due to the confinement of the fin spacers 128", the width W1 is substantially equal to the width W2.

In some embodiments illustrated in FIGS. 2O and 2P, the semiconductor layers 104a-104c are trimmed before the semiconductor layers 102a-102c are removed to release the semiconductor nanostructures 104a'-104c'. However, embodiments of the disclosure are not limited thereto. Many variations and/or modifications can be made to embodiments of the disclosure. In some other embodiments, after the semiconductor layers 102a-102c are removed to release the semiconductor nanostructures 104a'-104c', the semiconductor nanostructures 104a'-104c' are trimmed.

Figures 6A, 6B:
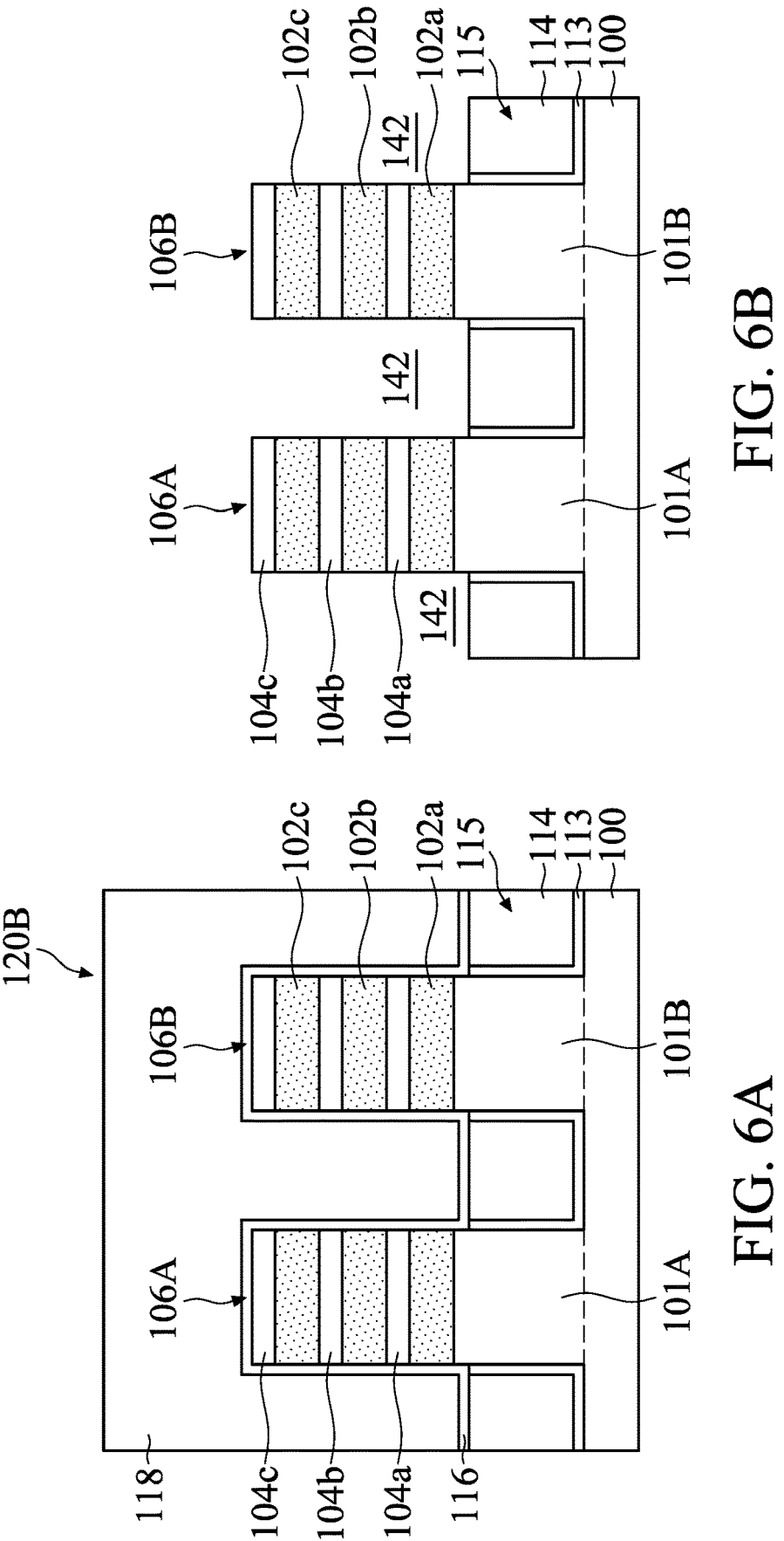
FIGS. 6A-6E are various cross-sectional views of various stages of a process for forming portions of a semiconductor device structure, in accordance with some embodiments.

FIGS. 6A-6E are various cross-sectional views of various stages of a process for forming portions of a semiconductor device structure, in accordance with some embodiments. As shown in FIG. 6A, a structure that is similar to the structure shown in FIG. 2M is formed, in accordance with some embodiments. In some embodiments, the semiconductor layers 104a-104c are substantially as thick as each other.

Figures 6C, 6D:
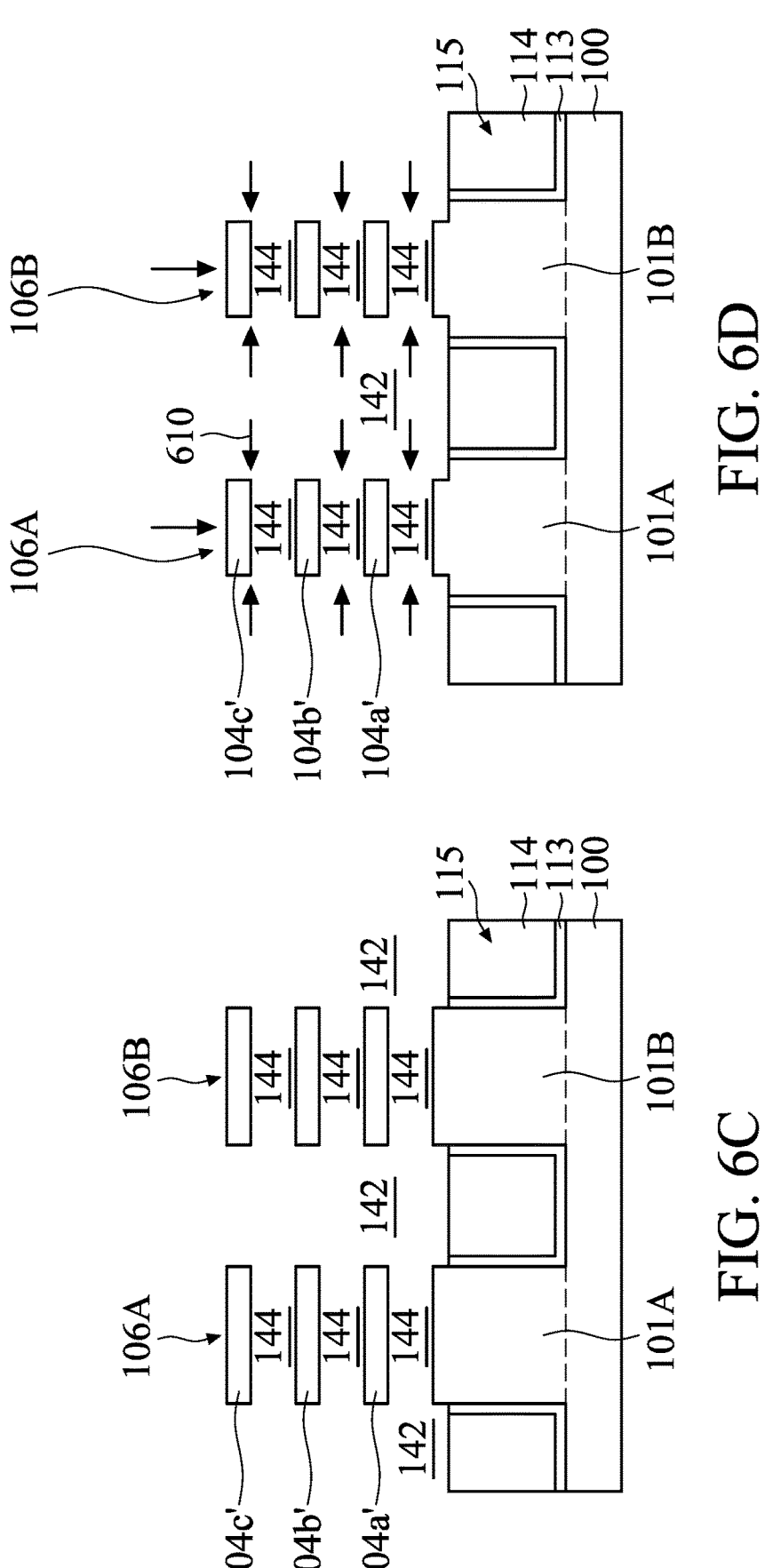

As shown in FIG. 6B, similar to the embodiments illustrated in FIG. 2N, the dummy gate stack 120B is removed. Afterwards, similar to the embodiments illustrated in FIG. 2P, the semiconductor layers 102a-102c are removed, as shown in FIG. 6C in accordance with some embodiments. As a result, multiple semiconductor nanostructures 104a'-104c' are formed.

As shown in FIG. 6D, an etching process 610 is used to trim the exposed portions of the semiconductor nanostructures 104a'-104c', in accordance with some embodiments. As a result, the exposed portions of the semiconductor nanostructures 104a'-104c' becomes narrower and thinner. In some embodiments, portions of the semiconductor nanostructures 104a'-104c' are covered and surrounded by the gate spacers 128' and the inner spacers 136, and are thus not trimmed by the etching process 610. The cross-sectional views of the semiconductor nanostructures 104a'-104c' taken along a plane that is parallel to the main surface of the semiconductor substrate 100 may be the same as or similar to those illustrated in FIGS. 3A, 3B, and 4.

Figure 6E:
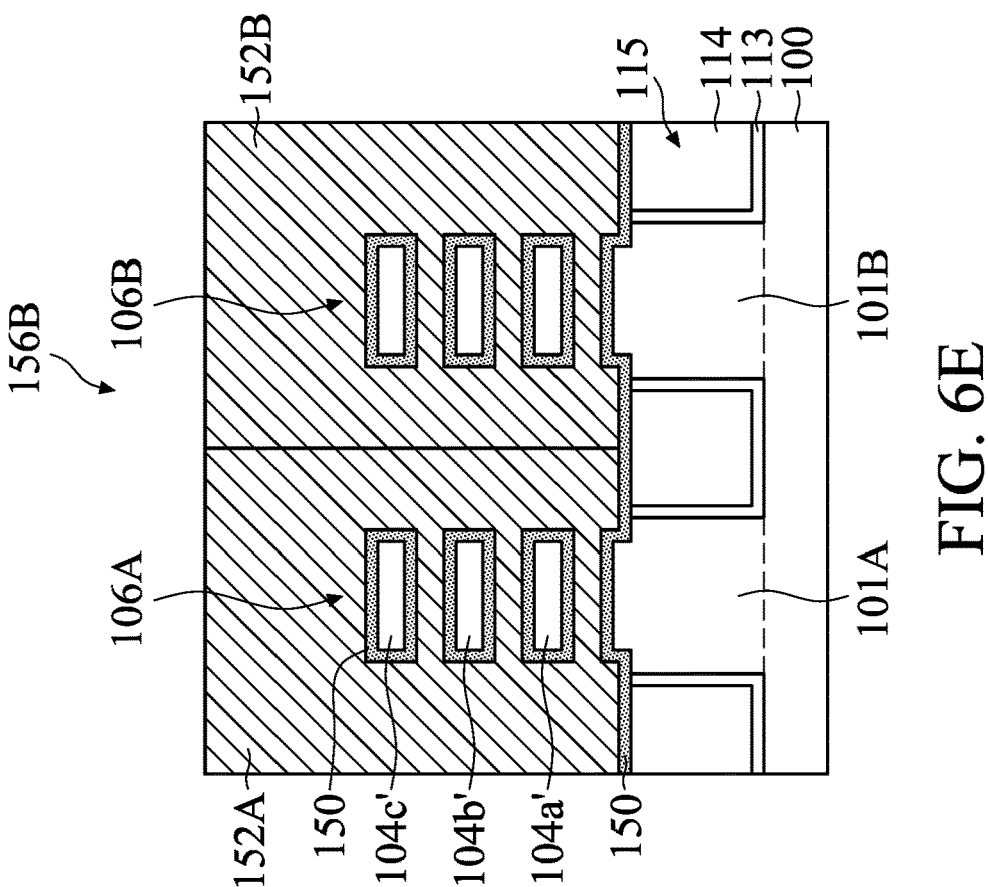

As shown in FIG. 6E, similar to the embodiments illustrated in FIGS. 2Q and 2Q-2, the metal gate stack 156B that is wrapped around the semiconductor nanostructures 104a'-104c' is formed, in accordance with some embodiments.

Figure 7:
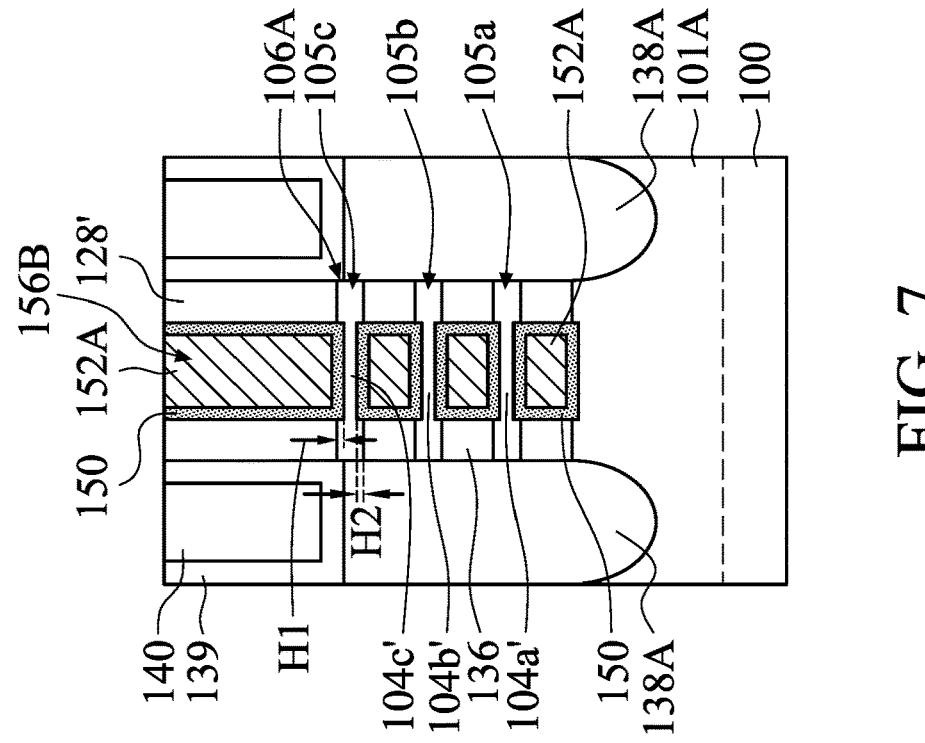
FIG. 7 is a cross-sectional view of a stage of a process for forming a portion of a semiconductor device structure, in accordance with some embodiments.

FIG. 7 is a cross-sectional view of a stage of a process for forming a portion of a semiconductor device structure, in accordance with some embodiments. In some embodiments, the structure shown in FIG. 7 is formed using the processes illustrated in FIGS. 6A-6E.

In some embodiments, the edge portion 105c protrudes from the top surface of the intermediate portion of the semiconductor nanostructure 104c' by a distance H1. In some embodiments, the top of the edge portion 105c is positioned at a higher height level than the top of the intermediate portion of the semiconductor nanostructure 104c'. In some embodiments, the bottom of the edge portion 105c is positioned at a lower height level than the bottom of the intermediate portion of the semiconductor nanostructure 104c'. The bottom of the intermediate portion of the semiconductor nanostructure 104c' is vertically higher than the bottom of the edge portion 105c by a distance H2. In some embodiments, the distance H1 is substantially equal to the distance H2.

Many variations and/or modifications can be made to embodiments of the disclosure. In some other embodiments, the fin structures formed over different regions of the semiconductor substrate 100 have different widths.

Figures 8A, 8B:
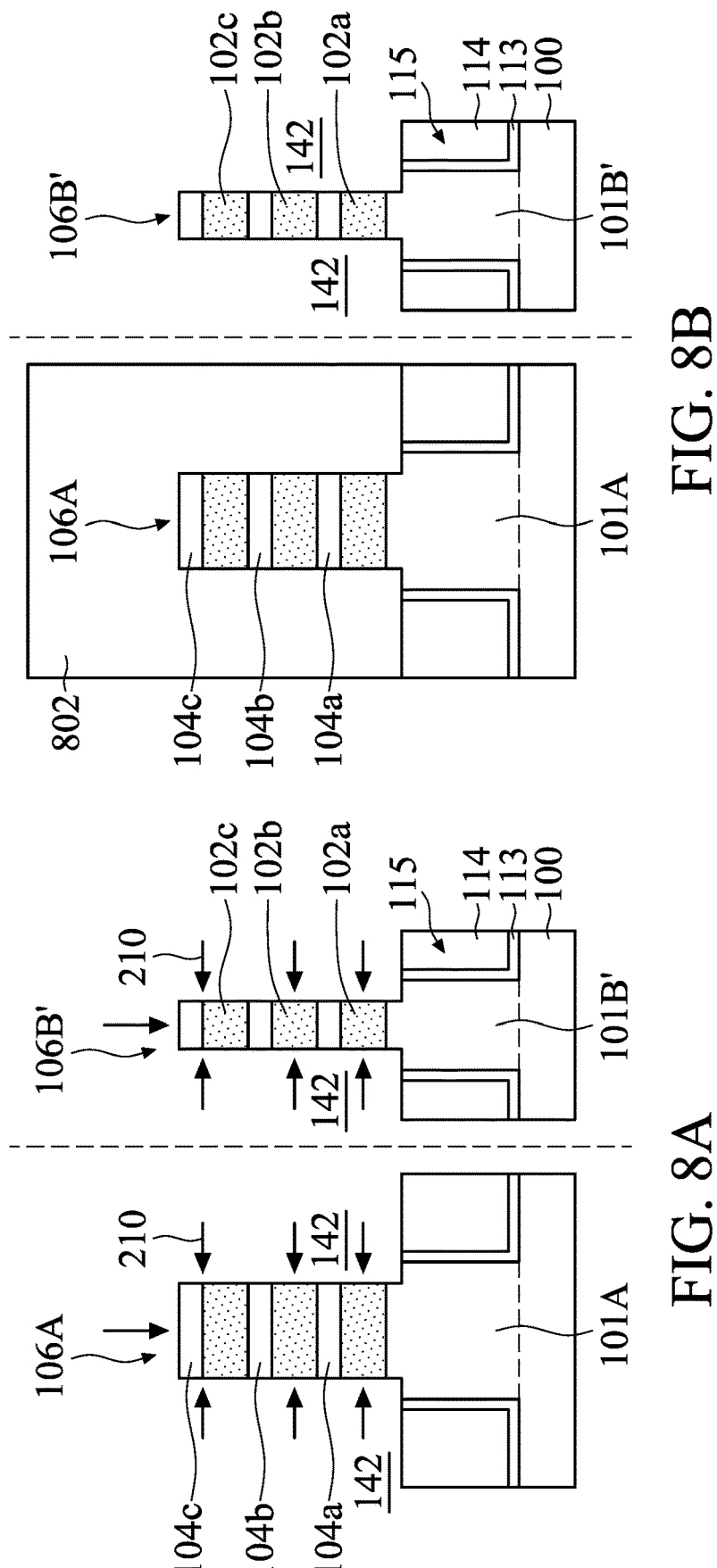
FIGS. 8A-8D are various cross-sectional views of various stages of a process for forming a portion of a semiconductor device structure, in accordance with some embodiments.

FIGS. 8A-8D are various cross-sectional views of various stages of a process for forming a portion of a semiconductor device structure, in accordance with some embodiments. As shown in FIG. 8A, similar to the embodiments illustrated in FIGS. 2A-2C, fin structures 106A and 106B' are formed, in accordance with some embodiments. In some embodiments, the fin structures 106A is wider than the fin structure 106B'. In some embodiments, the fin structure 106A is formed over a long channel device region of the semiconductor substrate 100, and the fin structure 106B is formed over a short channel device region of the semiconductor substrate 100.

Afterwards, the processes that are the same as or similar to those illustrated in FIGS. 2D-2O are performed, as shown in FIG. 8A in accordance with some embodiments. The fin structures 106A and 106B' are trimmed using the etching process 210.

As shown in FIG. 8B, a patterned mask element 802 is formed over the fin structure 106A, in accordance with some embodiments. The fin structure 106B' is exposed without being covered by the patterned mask element 802.

Figures 8C, 8D:
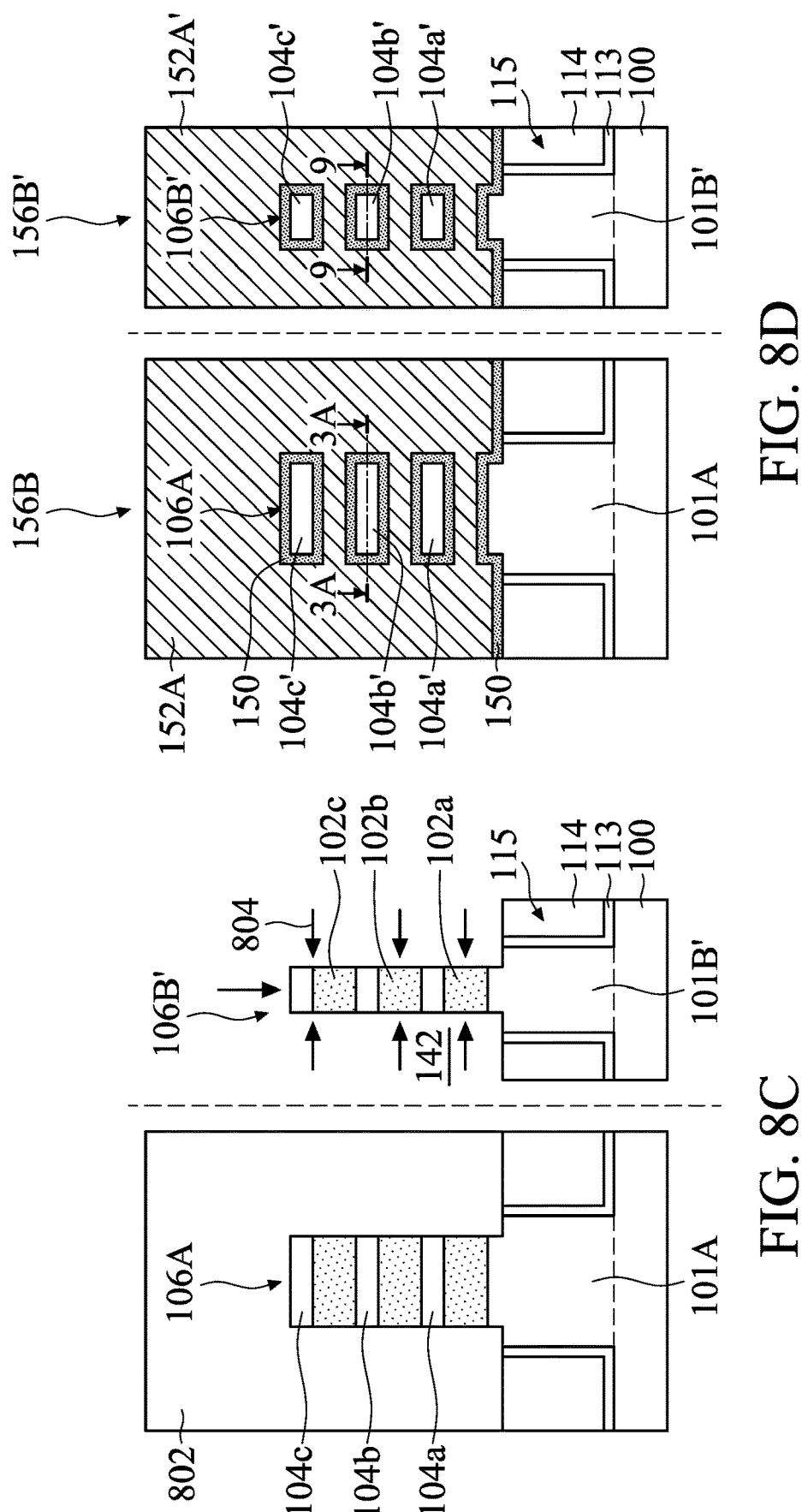

As shown in FIG. 8C, the fin structure 106B' is further trimmed using an etching process 804, in accordance with some embodiments. Afterwards, the processes that are the same as or similar to those illustrated in FIGS. 2Q and 2Q-2 are performed. As a result, the metal gate stack 156B and a metal gate stack 156B' with a metal gate electrode 152A' are formed, as shown in FIG. 8D in accordance with some embodiments. The material and formation method of the metal gate stack 156B' may be the same as or similar to those of the metal gate stack 156B.

Figure 9:
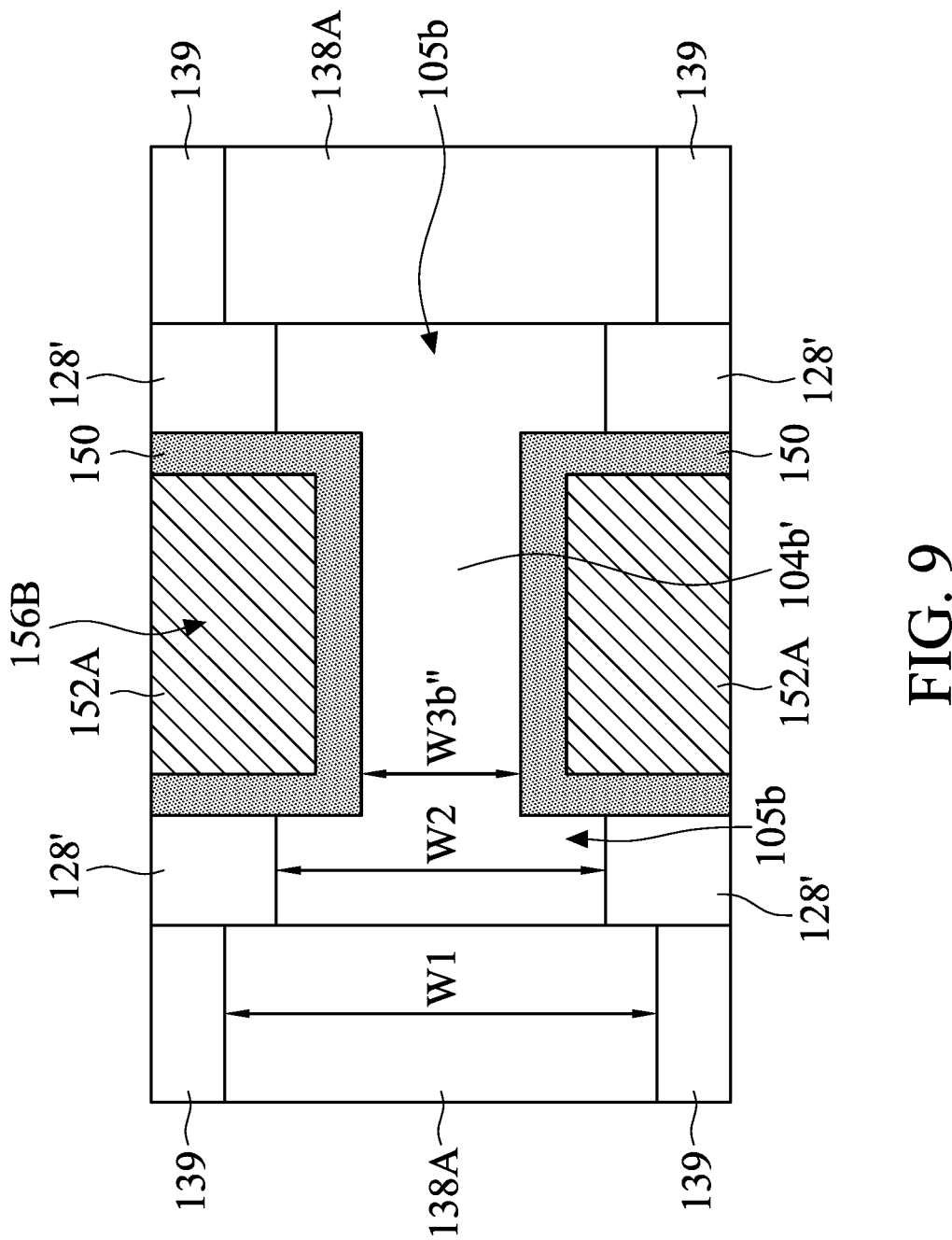
FIG. 9 is a cross-sectional view of a stage of a process for forming a portion of a semiconductor device structure, in accordance with some embodiments.

In some embodiments, the cross-sectional view of the structure taken along the line 3A-3A in FIG. 8D may be the same as or similar to that shown in FIG. 3A. FIG. 9 is a cross-sectional view of a stage of a process for forming a portion of a semiconductor device structure, in accordance with some embodiments. In some embodiments, FIG. 9 is a cross-sectional view of the structure taken along the line 9-9 in FIG. 8D.

As shown in FIGS. 8D and 9, the semiconductor nanostructure 104b' of the fin structure 106B' has an intermediate portion and edge portions 105b that are adjacent to the intermediate portion of the semiconductor nanostructure 104b'. The intermediate portion of the semiconductor nanostructure 104b' has a width W3b" that is measured along the lengthwise axis of the metal gate stack 156B. In some embodiments, the width W3b" is narrower than the width W3b illustrated in FIG. 3A.

As shown in FIG. 9, each of the edge portions 105b has a width W2 that is measured along the lengthwise axis of the metal gate stack 156B. In some embodiments, the width W2 is greater than the width W3b". The width difference (W2–W3b") between the widths W2 and W3b" may be within a range from about 1 nm to about 10 nm. In some embodiments, the width difference (W2–W3b") illustrated in FIG. 9 is greater than the width difference (W2–W3b) illustrated in FIG. 3A.

Due to the profile of the semiconductor nanostructure 104b', the metal gate stack 156B may create partial charge inversion regions in the edge portions 105b. The current spreading within the semiconductor nanostructure 104*b'* may be improved. The resistance may thus be reduced. The performance and reliability of the semiconductor device structure are greatly improved.

Many variations and/or modifications can be made to embodiments of the disclosure. In some embodiments, there are three channel structures (such as the semiconductor nanostructures 104*a'*-104*c'*) formed between the nearby epitaxial structures 138A or 138B. However, embodiments of the disclosure are not limited thereto. Many variations and/or modifications can be made to embodiments of the disclosure. In some embodiments, the total number of semiconductor nanostructures between the nearby epitaxial structures 138A or 138B is greater than three. In some other embodiments, the total number of semiconductor nanostructures between the nearby epitaxial structures 138A or 138B is smaller than three. The total number of semiconductor nanostructures (or channel structures) between the nearby epitaxial structures 138A or 138B may be fine-tuned to meet requirements. For example, the total number of semiconductor nanostructures between the nearby epitaxial structures 138A or 138B may be between 2 and 10. The semiconductor nanostructures may have many applicable profiles. The semiconductor nanostructures may include nanosheets, nanowires, or other suitable nanostructures.

Embodiments of the disclosure form a semiconductor device structure with semiconductor nanostructures. One or more etching processes are used to trim intermediate portions of the semiconductor nanostructures while the edge portions of the semiconductor nanostructures are protected by nearby elements such as gate spacers and inner spacers. Each of the edge portion may thus be wider and thicker than the respective intermediate portion. Due to the profile of the semiconductor nanostructure, the metal gate stack may create partial charge inversion regions in the edge portions. The resistance may thus be reduced. The performance and reliability of the semiconductor device structure are greatly improved.

In accordance with some embodiments, a method for forming a semiconductor device structure is provided. The method includes forming a fin structure over a substrate, and the fin structure has multiple sacrificial layers and multiple semiconductor layers laid out in an alternating manner. The method also includes forming a dummy gate stack extending across a portion of the fin structure and forming gate spacers over sidewalls of the dummy gate stack. The gate spacers extend across portions of the fin structure. The method further includes removing the dummy gate stack to form a trench exposing the portion of the fin structure and trimming the semiconductor layers exposed by the trench. Each of the semiconductor layers covered by the gate spacers becomes wider than each of the semiconductor layers that is trimmed. In addition, the method includes removing the sacrificial layers and forming a metal gate stack wrapped around the semiconductor layers.

In accordance with some embodiments, a method for forming a semiconductor device structure is provided. The method includes forming multiple sacrificial layers and multiple semiconductor layers laid out in an alternating manner over a substrate. The method also includes patterning the sacrificial layers and the semiconductor layers to form a first fin structure and a second fin structure. The method further includes forming a dummy gate stack extending across portions of the first fin structure and the second fin structure and forming gate spacers over sidewalls of the dummy gate stack. The gate spacers partially cover the first fin structure and the second fin structure. In addition, the method includes removing the dummy gate stack to form a trench partially exposing the first fin structure and the second fin structure. The method includes trimming the semiconductor layers of exposed portions of the first fin structure and the second fin structure after the trench is formed. Each of the semiconductor layers of the first fin structure and the second fin structure has a trimmed portion and an edge portion adjacent to the trimmed portion, and the edge portion is wider than the trimmed portion. The method also includes removing the sacrificial layers and forming a metal gate stack wrapped around the semiconductor layers of the first fin structure and the second fin structure.

In accordance with some embodiments, a semiconductor device structure is provided. The semiconductor device structure includes multiple semiconductor nanostructures and a gate stack wrapped around intermediate portions of the semiconductor nanostructures. Each of the intermediate portions has a first width measured along a lengthwise axis of the gate stack. The semiconductor device structure also includes a gate spacer over a sidewall of the gate stack, and the gate spacer surrounds edge portions of the semiconductor nanostructures. Each of the edge portions has a second width measured along the lengthwise axis of the gate stack, and the second width is greater than the first width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a fin structure over a substrate, wherein the fin structure has a plurality of sacrificial layers and a plurality of semiconductor layers laid out in an alternating manner;
   forming a dummy gate stack extending across a portion of the fin structure;
   forming gate spacers over sidewalls of the dummy gate stack, wherein the gate spacers extend across portions of the fin structure;
   removing the dummy gate stack to form a trench exposing the portion of the fin structure;
   trimming the semiconductor layers exposed by the trench such that each of the semiconductor layers covered by the gate spacers becomes wider than each of the semiconductor layers that is trimmed;
   removing the sacrificial layers; and
   forming a metal gate stack wrapped around the semiconductor layers.

2. The method for forming a semiconductor device structure as claimed in claim 1, further comprising:
   partially removing the fin structure to form a recess exposing side surfaces of the semiconductor layers and the sacrificial layers;
   forming a plurality of inner spacers covering the side surfaces of the sacrificial layers; and forming an epitaxial structure on the side surfaces of the semiconductor layers before the dummy gate stack is removed.

3. The method for forming a semiconductor device structure as claimed in claim 1, wherein the sacrificial layers are also trimmed during the trimming of the semiconductor layers.

4. The method for forming a semiconductor device structure as claimed in claim 3, wherein a topmost semiconductor layer of the semiconductor layers is thicker than a lower semiconductor layer of the semiconductor layers.

5. The method for forming a semiconductor device structure as claimed in claim 1, wherein the sacrificial layers are removed before the trimming of the semiconductor layers.

6. The method for forming a semiconductor device structure as claimed in claim 5, wherein each of the semiconductor layers is substantially as thick as each other.

7. The method for forming a semiconductor device structure as claimed in claim 1, further comprising:

forming a second fin structure over a substrate, wherein the fin structure is wider than the second fin structure, the second fin structure has a plurality of second sacrificial layers and a plurality of second semiconductor layers laid out in an alternating manner, and the second semiconductor layers are also trimmed during the trimming of the semiconductor layers;

forming a mask element covering the semiconductor layers after the trimming of the semiconductor layers, wherein the second semiconductor layers are exposed; and further trimming the second semiconductor layers while the semiconductor layers are covered by the mask element.

8. The method for forming a semiconductor device structure as claimed in claim 7, wherein:

each of the semiconductor layers has a first trimmed portion and a first edge portion adjacent to the first trimmed portion, the first edge portion is wider than the first trimmed portion by a first width difference, each of the second semiconductor layers has a second trimmed portion and a second edge portion adjacent to the second trimmed portion, the second edge portion is wider than the second trimmed portion by a second width difference, and the second width difference is greater than the first width difference.

9. The method for forming a semiconductor device structure as claimed in claim 1, further comprising:

forming a second fin structure over a substrate, wherein the second fin structure has a plurality of second sacrificial layers and a plurality of second semiconductor layers laid out in an alternating manner;

partially removing the fin structure and the second fin structure to form recesses exposing side surfaces of the semiconductor layers and the second semiconductor layers;

forming an n-type doped epitaxial structure on the side surfaces of the semiconductor layers;

forming a p-type doped epitaxial structure on the side surfaces of the second semiconductor layers; and trimming the second semiconductor layers during the trimming of the semiconductor layers.

10. The method for forming a semiconductor device structure as claimed in claim 9, wherein:

each of the semiconductor layers has a first trimmed portion and a first edge portion adjacent to the first trimmed portion, the first edge portion is wider than the first trimmed portion by a first width difference, each of the second semiconductor layers has a second trimmed portion and a second edge portion adjacent to the second trimmed portion, the second edge portion is wider than the second trimmed portion by a second width difference, and the first width difference is greater than the second width difference.

11. A method for forming a semiconductor device structure, comprising:

forming a plurality of sacrificial layers and a plurality of semiconductor layers laid out in an alternating manner over a substrate;

patterning the sacrificial layers and the semiconductor layers to form a first fin structure and a second fin structure;

forming a dummy gate stack extending across portions of the first fin structure and the second fin structure;

forming gate spacers over sidewalls of the dummy gate stack, wherein the gate spacers partially cover the first fin structure and the second fin structure;

removing the dummy gate stack to form a trench partially exposing the first fin structure and the second fin structure;

trimming the semiconductor layers of exposed portions of the first fin structure and the second fin structure after the trench is formed, wherein each of the semiconductor layers of the first fin structure and the second fin structure has a trimmed portion and an edge portion adjacent to the trimmed portion, and the edge portion is wider than the trimmed portion;

removing the sacrificial layers; and forming a metal gate stack wrapped around the semiconductor layers of the first fin structure and the second fin structure.

12. The method for forming a semiconductor device structure as claimed in claim 11, further comprising:

partially removing the fin structure and the second fin structure to form recesses exposing side surfaces of the semiconductor layers of the fin structure and the second fin structure;

forming an n-type doped epitaxial structure on the side surfaces of the semiconductor layers of the first fin structure; and forming a p-type doped epitaxial structure on the side surfaces of the semiconductor layers of the second fin structure.

13. The method for forming a semiconductor device structure as claimed in claim 12, wherein:

the edge portion of the first fin structure is wider than the trimmed portion of the first fin structure by a first width difference, the edge portion of the second fin structure is wider than the trimmed portion of the second fin structure by a second width difference, and the first width difference is greater than the second width difference.

14. The method for forming a semiconductor device structure as claimed in claim 11, wherein the sacrificial layers of the first fin structure and the second fin structure are also trimmed during the trimming of the semiconductor layers.

15. The method for forming a semiconductor device structure as claimed in claim 11, wherein the sacrificial layers of the first fin structure and the second fin structure are removed before the trimming of the semiconductor layers.

16. A semiconductor device structure, comprising:

a plurality of semiconductor nanostructures;

a gate stack wrapped around intermediate portions of the semiconductor nanostructures, wherein each of the intermediate portions has a first width measured along a lengthwise axis of the gate stack; and a gate spacer over a sidewall of the gate stack, wherein the gate spacer surrounds edge portions of the semiconductor nanostructures, each of the edge portions has a second width measured along the lengthwise axis of the gate stack, and the second width is greater than the first width.

17. The semiconductor device structure as claimed in claim 16, wherein each of the edge portions is thicker than each of the intermediate portions.

18. The semiconductor device structure as claimed in claim 16, wherein:

the edge portion of a topmost semiconductor nanostructure of the semiconductor nanostructures is thicker than the intermediate portion of the topmost semiconductor nanostructure of the semiconductor nanostructures by a first thickness difference, the edge portion of a lower semiconductor nanostructure of the semiconductor nanostructures is thicker than the intermediate portion of the lower semiconductor nanostructure of the semiconductor nanostructures by a second thickness difference, and the first thickness difference is greater than the second thickness difference.

19. The semiconductor device structure as claimed in claim 16, further comprising:

a plurality of second semiconductor nanostructures, wherein the gate stack is wrapped around second intermediate portions of the second semiconductor nanostructures, each of the second intermediate portions has a third width measured along the lengthwise axis of the gate stack, the third width is greater than the first width, and the second width is greater than the third width;

two n-type doped epitaxial structures, wherein the semiconductor nanostructures are between the n-type doped epitaxial structures; and two p-type doped epitaxial structures, wherein the second semiconductor nanostructures are between the p-type doped epitaxial structures.

20. The semiconductor device structure as claimed in claim 19, wherein:

the second width is greater than the first width by a first width difference, the gate spacer surrounds second edge portions of the second semiconductor nanostructures, each of the second edge portions has a fourth width measured along the lengthwise axis of the gate stack, the fourth width is greater than the third width by a second width difference, and the first width difference is greater than the second width difference.

\* \* \* \* \*